United States Patent [19]
Sterzer

[11] Patent Number: 6,008,748
[45] Date of Patent: Dec. 28, 1999

[54] MICROWAVE PHASE LOGIC IMPLEMENTATIONS OF AN ANALOG-TO-DIGITAL CONVERTER

[76] Inventor: Fred Sterzer, 4432 Province Line Rd., Princeton, N.J. 08540

[21] Appl. No.: 08/931,115

[22] Filed: Sep. 16, 1997

[51] Int. Cl.[6] .............................. H03M 1/12; H03C 3/00
[52] U.S. Cl. ............................................ 341/155; 327/101
[58] Field of Search .................... 341/133, 155, 341/162, 144; 326/99; 333/100; 375/206; 380/34; 455/317, 326; 327/101

[56] References Cited

U.S. PATENT DOCUMENTS

| | | | |
|---|---|---|---|
| 4,379,285 | 4/1983 | Dooley | 341/162 |
| 4,608,555 | 8/1986 | Hoeft | 341/133 |
| 5,283,583 | 2/1994 | Ichihara | 341/162 |
| 5,381,147 | 1/1995 | Birkmayer | 341/137 |
| 5,499,027 | 3/1996 | Karanicolas et al. | 341/120 |
| 5,528,174 | 6/1996 | Sterzer | 326/99 |
| 5,528,175 | 6/1996 | Sterzer | 326/99 |
| 5,629,702 | 5/1997 | Koyasu et al. | 341/155 |

*Primary Examiner*—Michael Tokar
*Assistant Examiner*—Patrick Wamsley

[57] ABSTRACT

An N-bit analog to biphase-encoded analog-to digital converter, which comprises (1) a biphase amplitude modulator responsive to an analog signal and a microwave pump carrier frequency $f_c$ for deriving a biphase-encoded carrier signal having a phase value determined by the current polarity of the analog signal and a peak amplitude determined by the current magnitude of the analog signal, and (2) an ordinally-arranged group of comparators. The modulator and the comparators, in order, derive fixed-amplitude, biphase-encoded output signals, each having a phase value indicative of a separate one of the most significant bit (MSB) to the Nth MSB in response to a biphase-encoded, modulated-carrier signal and the pump carrier frequency $f_c$ applied as inputs to each of the ordinally-arranged comparators. A corresponding ordinally-arranged group of sample and hold circuits, each responsive to an applied periodically-occurring sample clock from a sample clock circuit, are used to sample and then hold for a sample period the then-current phase of each of the MSB to Nth MSB output signals from comparators. Alternatively, a sample latch included in each of the group of comparators can replace the sample and hold circuits. Doubly-balanced mixers, each operating as either a modulator or a demodulator, are used to implement the biphase amplitude modulator, each of the comparators, each of the sample and hold circuits and sample clock circuit.

29 Claims, 13 Drawing Sheets

MICROWAVE PHASE LOGIC IMPLEMENTATIONS OF AN ANALOG-TO-DIGITAL CONVERTER

This invention was made with Government support and the Government has certain rights to this invention.

BACKGROUND OF THE INVENTION

Incorporated by reference herein is my U.S. Pat. No. 5,528,174, entitled "Devices for Implementing Microwave Phase Logic," which issued Jun. 18, 1996 and is assigned to the same assignee as the present invention. This patent is directed to the use of respective microwave devices employing doubly-balanced mixers that implement each of various microwave phase logic (MPL) functions that make use of biphase encoding. Specifically, these MPL functions include those of a phase regenerator, a memory element for a biphase-encoded signal, a sample-and-hold circuit for temporarily storing the binary value represented by a transient biphase-encoded signal, an EXCLUSIVE OR circuit, and a FULL ADDER circuit.

Further, as brought out in this patent, it would be very difficult to design a baseband digital-information handling system that employs prior-art logic devices using D.C. amplitude pulse and RF pulse binary encoding for a signal that starts at or near D.C. and extends to microwave with a multi-gigahertz bandwidth. However, a multi-gigahertz bandwidth (e.g., up to 5 GHz) would be a moderate percentage of a relatively high continuous microwave carrier frequency (e.g., 40 GHz) that employs biphase encoding.

SUMMARY OF THE INVENTION

The present invention is directed to extending the use of microwave devices to a multibit MPL analog-to-digital (A/D) converter, wherein such an A/D converter preferably employs doubly-balanced mixers to implement its MPL functions.

More specifically, the present invention is primarily directed to an N-bit analog to biphase-encoded AID converter comprising (1) a biphase amplitude modulator responsive to an analog signal and a pump P carrier frequency $f_c$ for deriving a biphase-encoded carrier signal having a phase value determined by the current polarity of the analog signal and a peak amplitude determined by the current magnitude of the analog signal, and (2) an ordinally-arranged group of interconnected comparators 1 to N, each of which, in order, derives a fixed-amplitude, biphase-encoded output signal having a phase value indicative of the binary value of a separate one of the most significant bit (MSB) to the Nth MSB in response to the biphase-encoded carrier signal from the modulator being applied, at least, to the input to the first of the ordinally-arranged group of comparators 1 to N and the pump P carrier frequency $f_c$ being applied as inputs to each of the ordinally-arranged group of comparators 1 to N.

Further, a corresponding group of sample and hold circuits 1 to N, each responsive to an applied periodically-occurring sample clock from a sample clock means, may be used to sample and then hold for a sample period the then-current phase of each of the MSB to Nth MSB output signals from comparators 1 to N. Alternatively, a sample latch included in each of the group of comparators may be used for this purpose.

DESCRIPTION OF THE PREFERRED EMBODIMENTS

Figure 1:
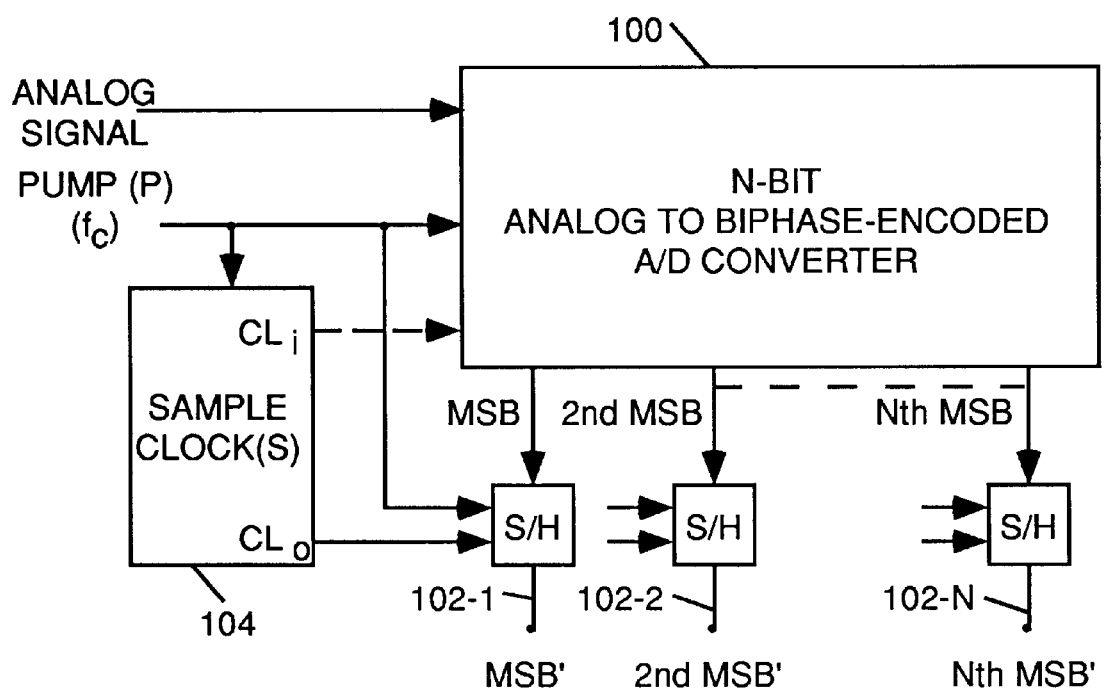
FIG. 1 shows in block form a generic MPL embodiment of an A/D conversion means incorporating the principles of the present invention.

Referring to the functional block diagram of FIG. 1, there is shown (1) N-bit analog to biphase-encoded A/D converter 100, (2) sampling and hold (S/H) means 102-1 to 102-N, and (3) sample clock(s) means 104 which includes timing circuitry for deriving output sample clock $CL_o$ and, optionally, also input sample clock $CL_i$.

The input to A/D converter 100 includes an analog signal that has a baseband bandwidth that may extend from near D.C. to a multi-gigahertz frequency. The peak amplitude of this analog signal (which is assumed to be a continuous signal) varies with respect to time in a range between given maximum positive and maximum negative values. The input to A/D converter 100 also includes a pump P microwave carrier frequency $f_c$ (e.g., 40 GHz) which is several times higher than the highest frequency component of the input analog signal (e.g., 5 GHz). If desired, A/D converter 100 may include means responsive to the optional application thereto (shown by dotted line) of input sample clock $CL_i$ for periodically deriving a sample having an amplitude corresponding to the amplitude of the input analog signal at that time. However, such sampling of the input analog signal is not essential.

A/D converter 100 derives binary-valued multibit (N-bit) outputs that extend, in order, from the most-significant-bit (MSB) to the Nth MSB of the current value of the polarity and magnitude of the amplitude of analog signal at that time. Each of the MSB to Nth MSB outputs is a biphase-encoded, fixed amplitude, carrier frequency $f_c$ packet (i.e., the packet has either a given phase value (e.g., 0°) indicative of the first of the two possible binary values of that bit or a phase value opposite to the given phase value (e.g., 180°) indicative of the second of the two possible binary values of that bit). The phase value of the MSB bit is indicative of the polarity (+ or −) of the amplitude of the analog signal at that time, while the respective phases of the 2nd MSB to Nth MSB bits are indicative of the magnitude of the amplitude of the analog signal at that time.

The MSB to Nth MSB outputs from A/D converter 100 are applied, respectively, as signal inputs to sampling and hold (S/H) means 102-1 to 102-N. Additional inputs applied to each S/H means 102-1 to 102-N the are (1) pump P carrier frequency $f_c$ and (2) output sample clock $CL_o$ for periodically sampling and then holding the biphase-encoded phase value (not the amplitude value) manifested by each of the signal inputs MSB to Nth MSB at that time. This results in the phase values of the respective MSB' to Nth MSB' outputs from each S/H means 102-1 to 102-N being available for digitally representing in binary form the value of each successive sample for substantially an entire sample period.

Figure 2:
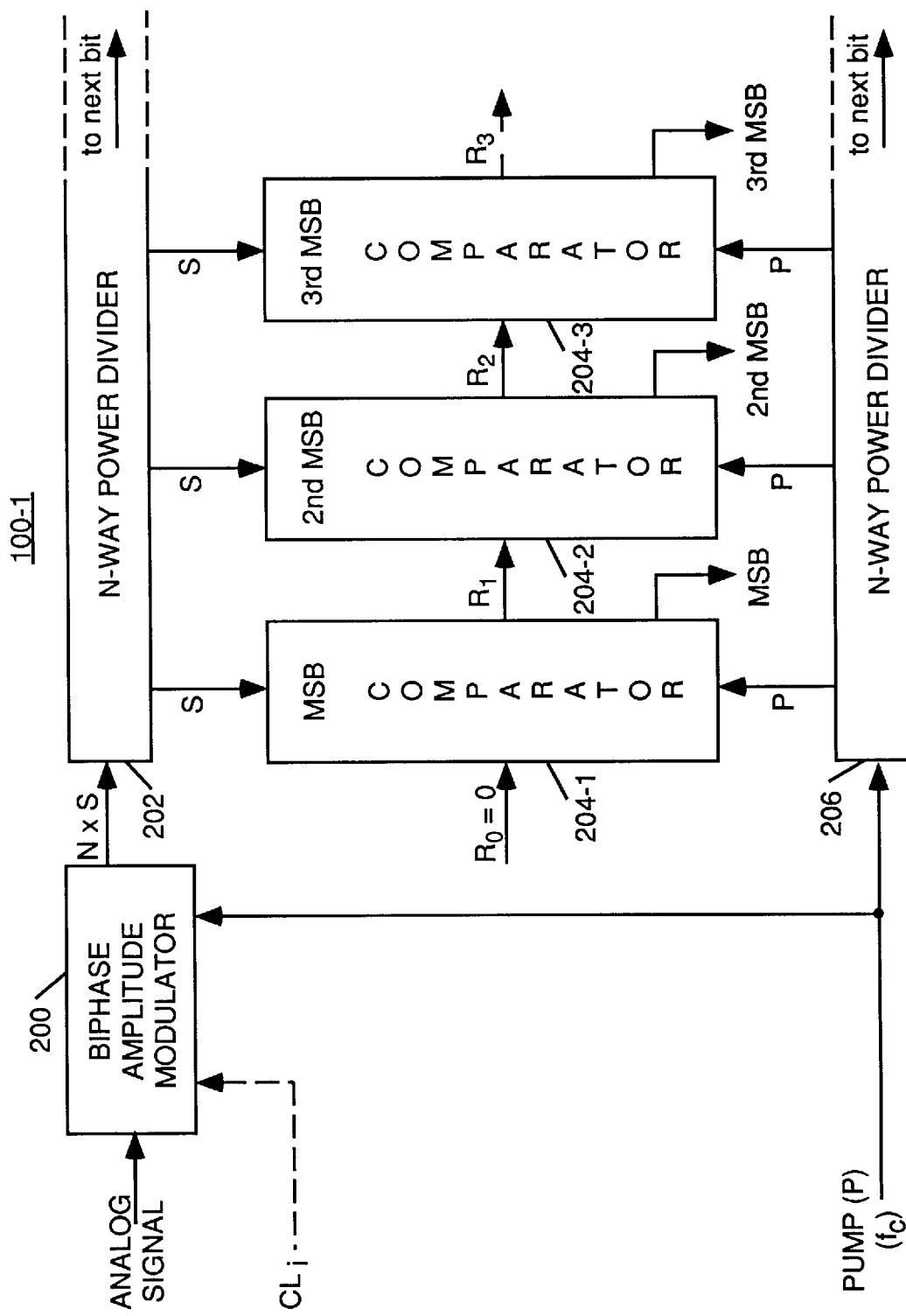
FIGS. 2 and 2a, together, show a first species of the N-bit analog to biphase-encoded A/D converter of FIG. 1, which employs N parallel-fed comparators.
Figure 2A:
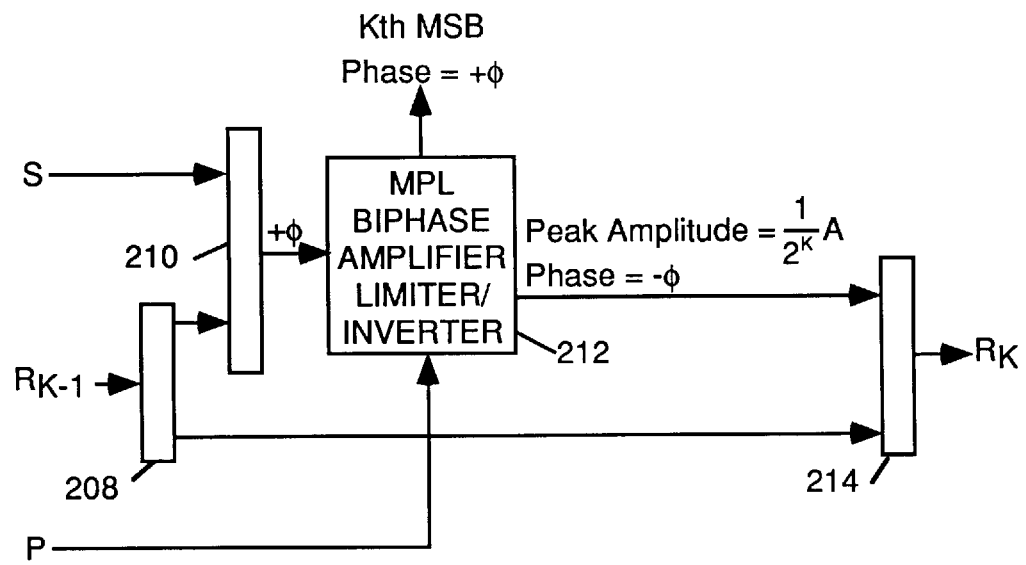
Figure 3A:
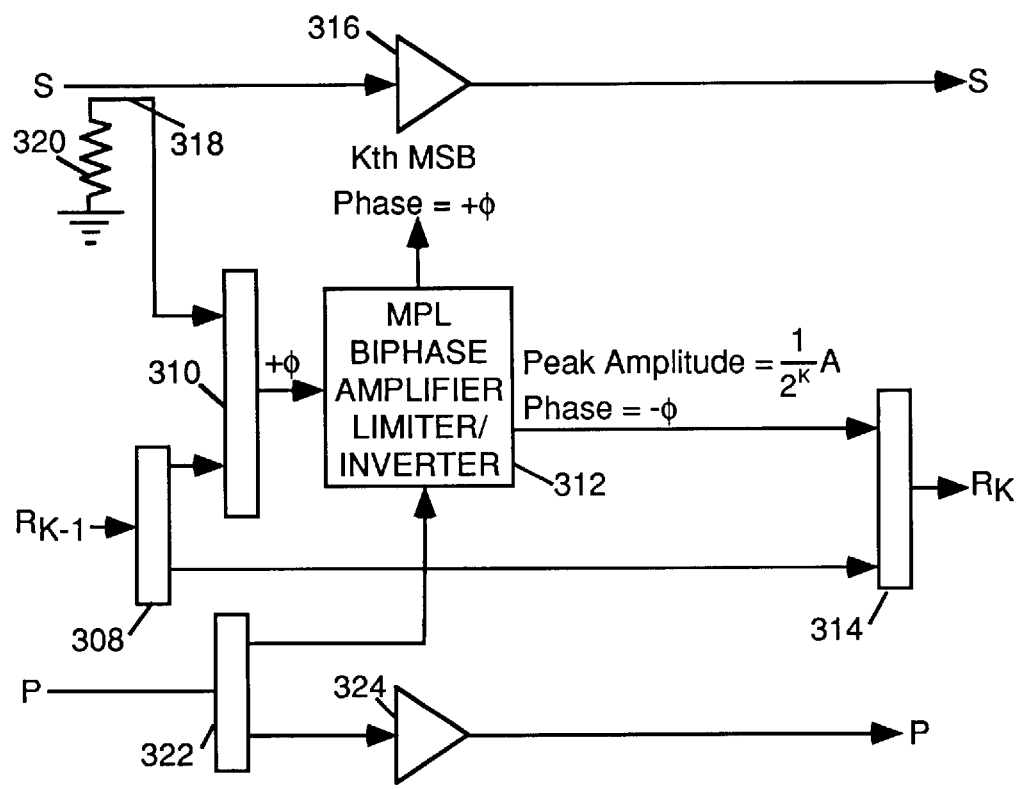
FIGS. 3 and 3a, together, show a second species of the N-bit analog to biphase-encoded A/D converter of FIG. 1, which employs N serial-fed comparators.
Figure 3:
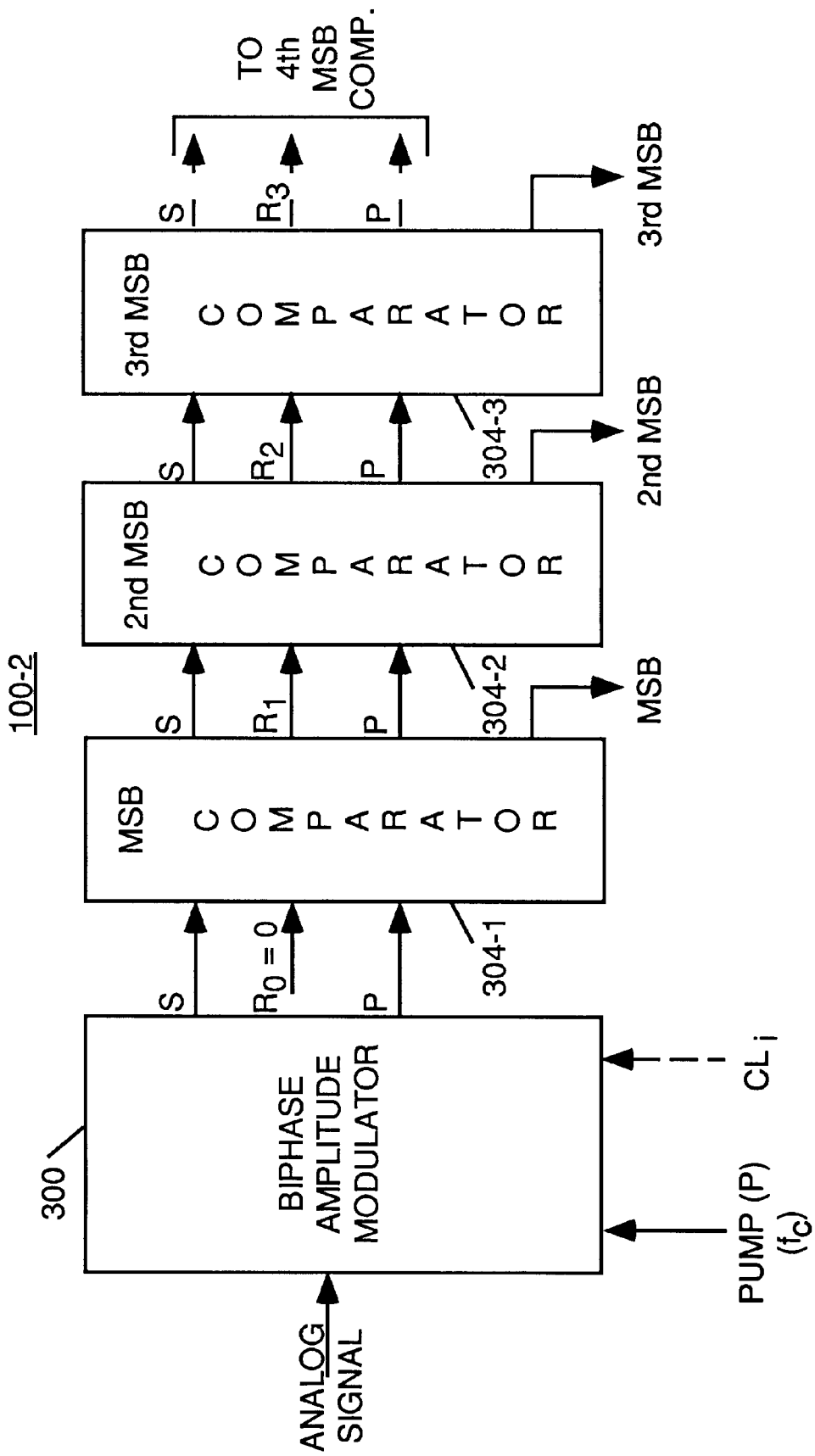
Figure 4:
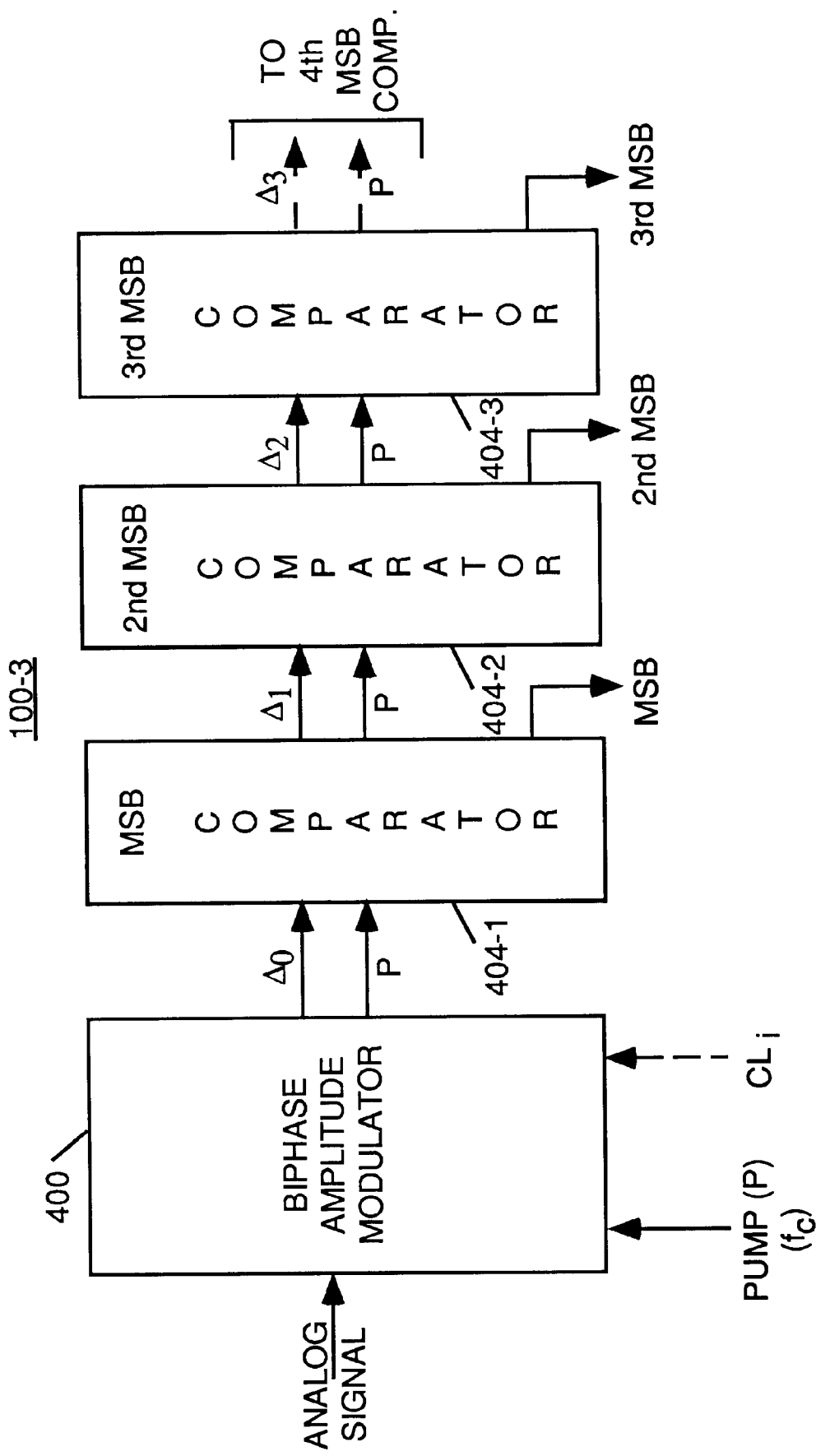
FIGS. 4 and 4a, together, show a third species of the N-bit analog to biphase-encoded A/D converter of FIG. 1, which employs N serial differential comparators.
Figure 4A:
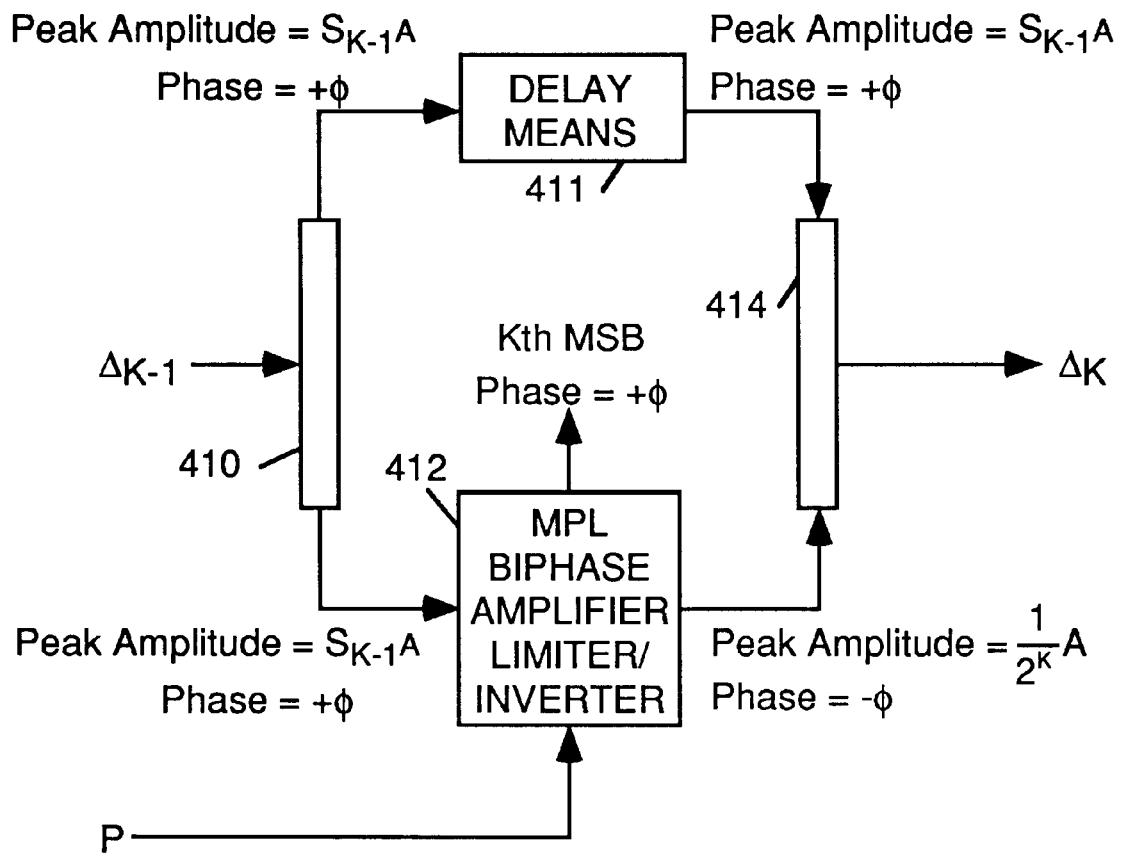

A/D converter 100 may be realized, alternatively, in (1) a parallel-fed first species 100-1 thereof, functionally shown in block diagram in FIGS. 2 and 2*a*, or (2) a serial-fed (pipelined) second species 100-2 thereof, functionally shown in block diagram in FIGS. 3 and 3*a* or (3) a serial, differential-fed (pipelined) third species 100-3 thereof, functionally shown in block diagram in FIGS. 4 and 4*a*.

Figure 5A:
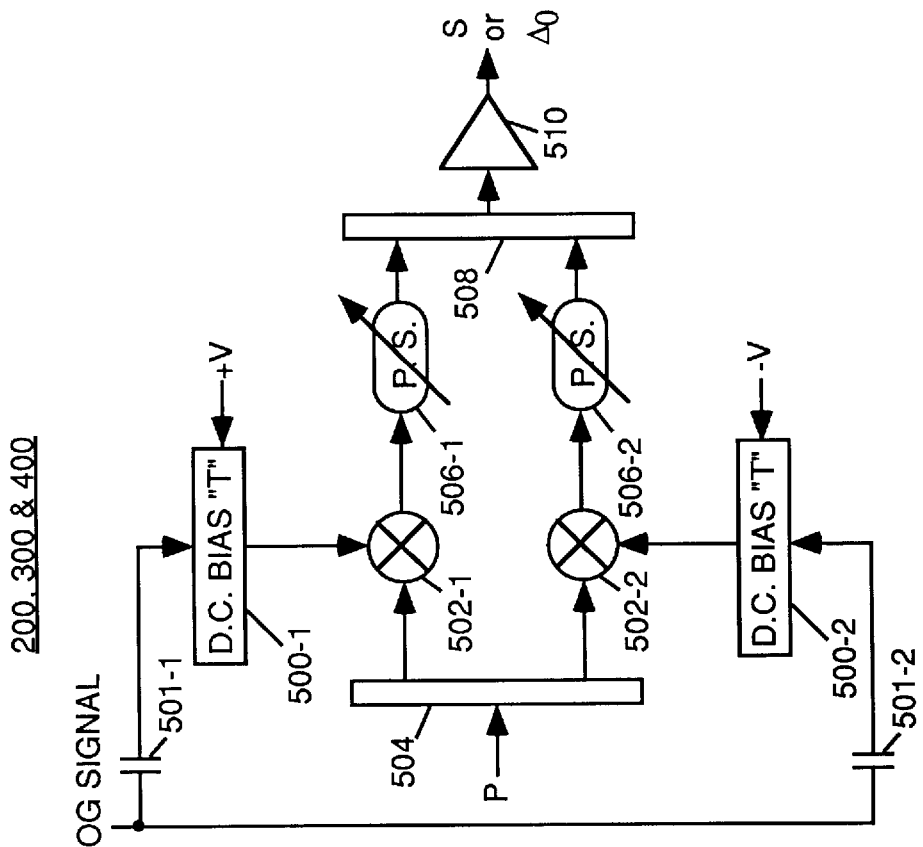
FIGS. 5 and 5a, respectively, schematically show first and second embodiments, incorporating doubly-balanced mixers, of the biphase amplitude modulator employed by each of FIGS. 2, 3 and 4.
Figure 5:
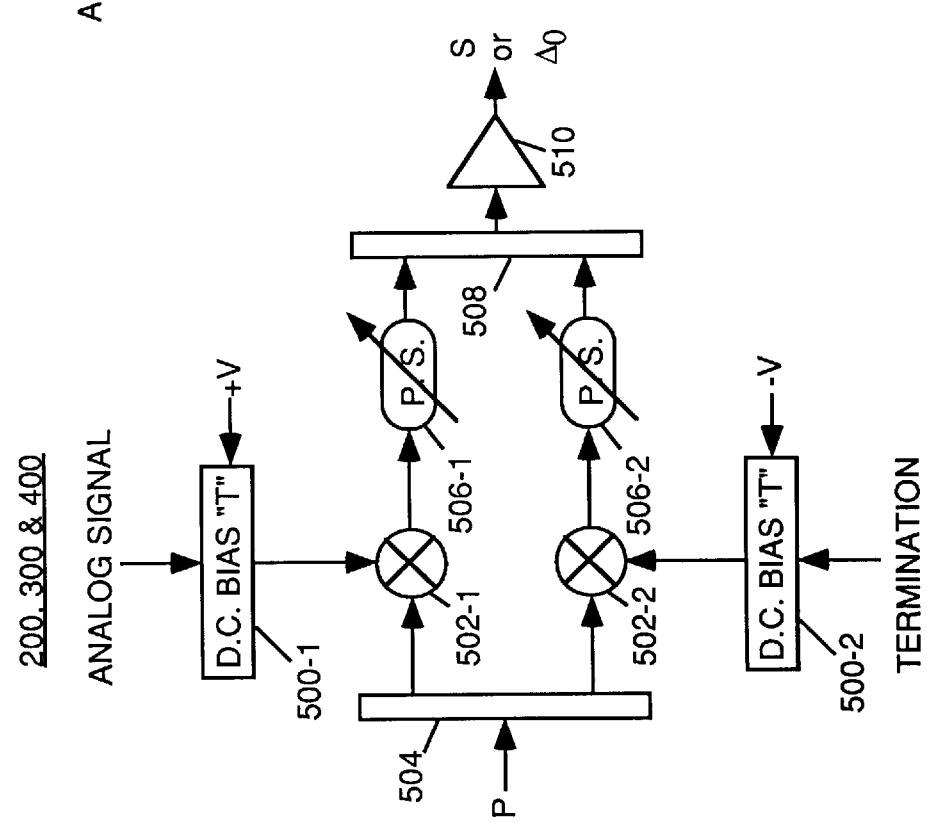

Referring to FIG. 2, A/D converter 100-1 comprises biphase amplitude modulator 200 (which may be implemented as shown in FIG. 5, discussed below). Modulator 200 derives an output in which its input pump P carrier frequency $f_c$ is amplitude modulated in time in accordance with the then-current polarity value and magnitude value of its input analog signal. As is known, (1) a positive current polarity value results in the modulator's then-current output having a given (e.g., 0°) phase value; (2) a negative current polarity value results in the modulator's then-current output having a phase value (e.g., 180°) opposite to the given phase value, and (3) a current carrier peak amplitude value of the amplitude-modulated output proportional to the then-current magnitude of the input analog signal. If modulator 200 employs optional sampling by input sample clock $CL_i$, the carrier amplitude value of the amplitude-modulated output will remain constant for the entire period of each successive sample. However, use of the optional sampling process increases the likelihood of introducing errors in the carrier amplitude values of the amplitude-modulated output samples. For this reason, it will henceforth be assumed that optional sampling by input sample clock $CL_i$ is not used, so that the output from modulator 200 is a continuous signal.

As indicated in FIG. 2, the modulated carrier output signal from modulator 200 (that has a relativity broad bandwidth) is a biphase-encoded signal, which is a applied as an input to first N-way power divider 202, has a relative power that is N times that of each of its N component output information signals S. Each of these N component output information signals S is applied as a signal input to comparator 204-1, that derives in biphase-encoded form the MSB binary value which designates the polarity of the analog signal, and a separate one of comparators 204-2 to 204-N (only comparators up to 204-3 being shown in FIG. 2) that, respectively, derive in biphase-encoded form the 2nd MSB to Nth MSB binary values designating, in order, the most significant to the (N−1)th most significant bit of the magnitude of the analog signal. In a similar manner, the pump P carrier frequency $f_c$ (that has a very narrow bandwidth, since it is a pure tone) is applied as an input to second N-way power divider 206 and each of its N output component is applied as an input to a separate one of comparators 204-1 to 204-N.

Further, comparator 204-1 (1) has a reference $R_0$ having a magnitude value of 0 applied as an input thereto and (2) derives as an output a biphase-encoded reference $R_1$ which is applied as an input to comparator 204-2. Generalizing, each comparator 204-K (where K is any ordinal one of comparators 204-1 to 204-N) has a biphase-encoded reference $R_{K-1}$ applied as an input thereto, which has a 0 value in the case of comparator 204-1, or was derived as an output from comparator 204-(K−1) in the case of each of comparators 204-2 to 204-N. Each comparator 204-K (except possibly comparator 204-N) derives biphase-encoded reference $R_K$ as an output therefrom.

FIG. 2*a* shows the relationships among the biphase-encoded information signal S, the input biphase-encoded reference $R_{K-1}$ and the output biphase-encoded reference $R_K$ of comparator 204-K. As shown in FIG. 2*a*, input biphase-encoded reference $R_{K-1}$ is forwarded through coupler 208 to coupler 210, where it is then combined in coupler 210 with biphase-encoded information signal S to provide an output from coupler 210 exhibiting a relative phase (designated +φ) which has the same phase value as that one of reference $R_{K-1}$ and information signal S which has the higher amplitude. The output from coupler 210 is applied as an input to MPL biphase amplifier limiter/inverter 212 (which is preferably implemented as shown by FIG. 5, discussed below). Amplifier limiter/inverter 212 derives, as the Kth MSB output of comparator 204-K, a first biphase-encoded carrier output having a first certain fixed peak amplitude which is independent of the peak amplitude of the input to amplifier limiter/inverter 212, but exhibits the same relative phase value +φ as the phase value of the input to amplifier limiter/inverter 212. Further, amplifier limiter/inverter 212 derives a second biphase-encoded carrier output which exhibits a relative phase value −φ opposite to the phase value relative phase value +φ of the biphase-encoded carrier input (due to phase inversion provided by biphase amplifier limiter/inverter 412). However, the absolute peak amplitude of the second biphase-encoded carrier output is $1/2^K$ A (where A designates a second certain fixed peak amplitude carrier). This second output from amplifier limiter 212 is combined in coupler 214 with the input biphase-encoded reference $R_{K-1}$ forwarded to coupler 214 through coupler 208 to thereby derive output biphase-encoded reference $R_K$ at the output of coupler 214. Therefore, the peak amplitude of the biphase-encoded reference $R_K$ is equal to the algebraic sum of the peak amplitude of the biphase-encoded reference $R_{K-1}$ and the $1/2^K A$ peak amplitude of the second biphase-encoded carrier output from amplifier limiter/inverter 212.

As shown in FIG. 3, the serial-fed (pipelined) second species 100-2 of A/D converter 100 comprises biphase amplitude modulator 300 that is responsive to an analog signal, a pump P carrier frequency $f_c$ and an optional sample clock $CL_i$ applied, respectively, as inputs thereto. Modulator 300 (which is preferably implemented as shown in FIG. 5, discussed below) is similar in structure to the above-described modulator 200 except that (1) the relative amplitude power of the biphase-encoded, modulated-carrier output signal from modulator 300 is only S (rather than N times S) and (2) the pump P carrier frequency $f_c$ input to modulator 300 is pipeline-fed through modulator 300 as an output therefrom. Then, both the biphase-encoded, modulated-carrier information signal S and pump P carrier frequency $f_c$ outputs from modulator 300 are pipeline-fed to and through each of comparators 304-1 to 304-N (only comparators up to 304-3 being shown in FIG. 3). This pipeline feed to and through each comparator 304-K (where K is any ordinal one of comparators 304-1 to 304-N) is shown in more detail FIG. 3a.

Referring to FIG. 3a, MPL biphase amplifier limiter/inverter 312 and each of couplers 308, 310 and 314 perform the same above-described functions as MPL biphase amplifier limiter/inverter 212 and each of couplers 208, 210 and 214 of FIG. 2a. However, in FIG. 3a, (1) the biphase-encoded information signal S input to comparator 304-K is pipelined through amplifier 316 to the biphase-encoded information signal S output from comparator 304-K; (2) directional coupler 318, terminated by resistance 320, is used to forward the biphase-encoded information signal S input to coupler 310; and (3) the pump P carrier frequency $f_c$ input to comparator 304-K is divided by coupler 322 into a first portion, which is forwarded as an input to MPL biphase amplifier limiter 312, and a second portion, which is pipelined through amplifier 324 to the output of comparator 304-K.

The following table depicts the relationship between the normalized amplitude values of information signal S and each of the respective references $R_1$, $R_2$, $R_3$ and $R_4$ for the case of four comparators (i.e., N=4) of the type described above in FIGS. 2 and 2a and the type described above in FIGS. 3 and 3a:

| MSB | $R_1$ | 2nd MSB | $R_2$ | 3rd MSB | $R_3$ | 4th MSB | $R_4$ |
|---|---|---|---|---|---|---|---|
| | | | | MSB OUTPUT PHASE POSITIVE | | | |
| | | | | | | $1 \geq S > 7/8$ | $-15/16$ |
| | | | | $1 \geq S > 3/4$ | $-7/8$ | | |
| | | | | | | $7/8 \geq S > 3/4$ | $-13/16$ |
| | | $1 \geq S > 1/2$ | $3/4$ | | | | |
| | | | | | | $3/4 \geq S > 5/8$ | $-11/16$ |
| | | | | $3/4 \geq S > 1/2$ | $-5/8$ | | |
| | | | | | | $5/8 \geq S > 1/2$ | $-9/16$ |
| $S > 0$ | $-1/2$ | | | | | | |
| | | | | | | $1/2 \geq S > 3/8$ | $-7/16$ |
| | | | | $1/2 \geq S > 1/4$ | $-3/8$ | | |
| | | | | | | $3/8 \geq S > 1/4$ | $-5/16$ |
| | | $1/2 \geq S > 0$ | $1/4$ | | | | |
| | | | | | | $1/4 \geq S > 1/8$ | $-3/16$ |
| | | | | $1/4 \geq S > 0$ | $-1/8$ | | |
| | | | | | | $1/8 \geq S > 0$ | $-1/16$ |
| | | | | MSB OUTPUT PHASE NEGATIVE | | | |
| | | | | | | $-0 \geq S > -1/8$ | $+1/16$ |
| | | | | $0 \geq S > -1/4$ | $1/8$ | | |
| | | | | | | $-1/8 \geq S > -1/4$ | $+3/16$ |
| | | $0 \geq S > -1/2$ | $3/4$ | | | | |
| | | | | | | $-1/4 \geq S > -3/8$ | $+5/16$ |
| | | | | $-1/4 \geq S > -1/2$ | $3/8$ | | |
| | | | | | | $-3/8 \geq S > -1/2$ | $+7/16$ |
| $S \leq 0$ | $1/2$ | | | | | | |
| | | | | | | $-1/2 \geq S > -5/8$ | $+9/16$ |
| | | | | $-1/2 \geq S > -3/4$ | $5/8$ | | |
| | | | | | | $-5/8 \geq S > -3/4$ | $+11/16$ |
| | | $-1/2 \geq S > -1$ | $1/4$ | | | | |
| | | | | | | $-3/4 \geq S > -7/8$ | $+13/16$ |
| | | | | $-3/4 \geq S > -1$ | $7/8$ | | |
| | | | | | | $-7/8 \geq S > -1$ | $+15/16$ |

Figure 3B:
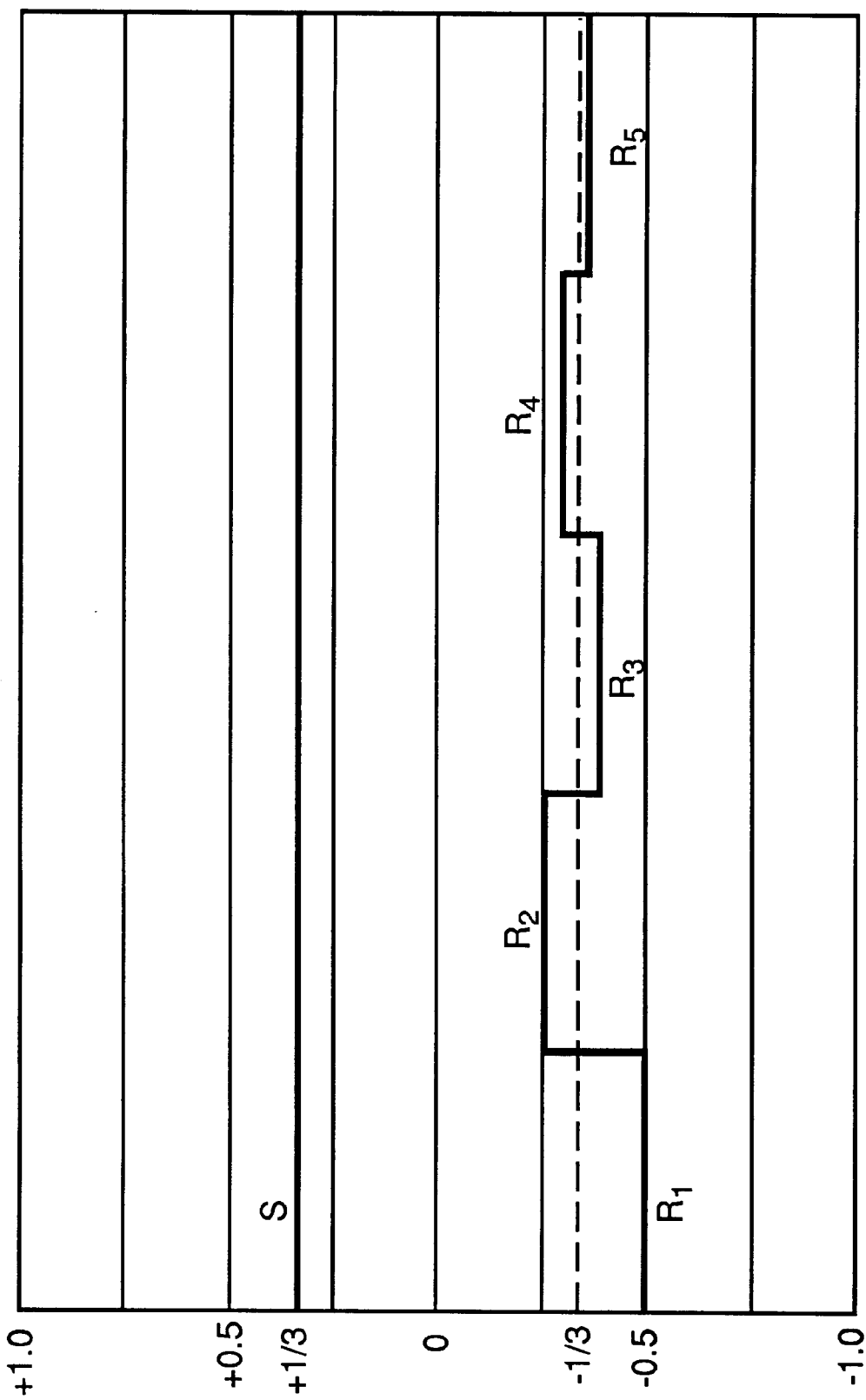
FIG. 3b is a graph showing the relationship among and the outputs of each of the first four differential comparators of FIG. 3 for the assumed example in which the input to the first comparator has a normalized amplitude of +0.33

For illustrative purposes, FIG. 3b is a graph exemplifying the relationship among references $R_1$, $R_2$, $R_3$, $R_4$ for the particular case in which S has a normalized amplitude of +0.33.

In the above table, "+" is indicative of those biphase-encoded, amplitude-modulated carrier values of information signal S which have a given phase, e.g., 0°, and "−" is indicative of those biphase-encoded, amplitude-modulated carrier values of information signal S which have a phase opposite to this given phase, e.g., 180°. Further, generalizing from the values for references $R_1$, $R_2$, $R_3$, $R_4$ for any particular value of information signal S set forth in the above table (such as exemplified by a value of +0.33 in the FIG. 3 graph), it becomes apparent that the values for references $R_1$, $R_2$, $R_3$, $R_4$, . . . $R_{N-1}$ for any particular value of information signal S asymptotically approach the negative value, −S, of the information signal as the value for $R_{N-1}$ is approached.

Although the Nth MSB comparator of FIG. 2 or 3 does not need to generate an $R_N$ reference output, an $R_N$ reference is useful in checking the accuracy of the respective comparators by determining whether or not the value of the $R_N$ reference differs from the negative of the current value of information signal S (i.e., −S) by no more than the very small amount of $$\pm \frac{1}{2^N}.$$

This is an important advantage because it simplifies the otherwise very difficult measurement process for checking the accuracy of the respective comparators of FIG. 2 or 3 for an amplitude-modulated input information signal S with multi-gigahertz components.

As shown in FIG. 4, the serial (pipelined) differential comparators third species 100-3 of A/D converter 100 comprises biphase amplitude modulator 400 that, like modulators 200 and 300, is responsive to an analog signal, a pump P carrier frequency $f_c$ and an optional sample clock $CL_j$ applied, respectively, as inputs thereto. Modulator 400 (which is preferably implemented as shown in FIG. 5, discussed below) is similar in structure to the above-described modulators 200 and 300. The relative amplitude power of the bipha se-encoded, modulated-carrier output signal from modulator 400 (applied as an information signal input to first comparator 404-1) is $\Delta_0$ (where, in accordance with the FIG. 5 embodiment of modulator 400, discussed below, the amplitude power of information signal $\Delta_0$ is determined by the difference between the amplitude of a first analog signal applied as the input to modulator 400 and a second analog signal assumed in FIG. 4 to have a zero amplitude).

Each of the respective outputs $\Delta_1$ to $\Delta_{N-1}$ from each of the comparators which precede comparator 404-N (only comparators up to 404-3 being shown in FIG. 4) is applied as an input to its immediately following comparator. The pump P carrier frequency $f_c$ input to modulator 400 is pipeline-fed through modulator 400 as an output therefrom. Then, the pump P carrier frequency $f_c$ output from modulator 300 is pipeline fed to and through each of comparators 404-1 to 404-N. This pipeline feed to and through each comparator 404-K (where K is any ordinal one of comparators 404-1 to 404-N) is shown in more detail FIG. 4a.

Referring to FIG. 4a, coupler 410 is effective in substantially dividing the power of the $\Delta_{K-1}$ biphase-encoded carrier input applied to the midpoint thereof in half at each of the upper and lower ends thereof. Therefore, the peak amplitude $S_{K-1}A$ of the biphase-encoded carrier signal output appearing at each of the upper and lower ends of coupler 410 is proportional to the peak amplitude of the $\Delta_{K-1}$ biphase-encoded carrier input to coupler 410. Further, the relative phase $+\phi$ of the biphase-encoded carrier signal output appearing at each of the upper and lower ends of coupler 410 is the same as the phase of the $\Delta_{K-1}$ biphase-encoded carrier input to coupler 410. The carrier signal output appearing at the lower end of coupler 410 is applied as a first input to MPL biphase amplifier limiter/inverter 412 and the pump P carrier frequency $f_c$ is applied as a second input to MPL biphase amplifier limiter/inverter 412. The Kth MSB having a fixed peak amplitude and a relative phase of $+\phi$ is derived as a first output and a biphase-encoded carrier output signal having an absolute peak amplitude of $1/2^K A$ and a relative phase of $-\phi$ (due to phase inversion provided by biphase amplifier limiter/inverter 412) is derived as a second output from MPL biphase amplifier limiter/inverter 412. The second output from MPL biphase amplifier limiter/inverter 412 is applied as an input to the lower end of coupler 414. The peak amplitude $S_{K-1}A$ signal, having the relative phase $+\phi$, at the upper end of coupler 410 (after a time delay by delay means 411 substantially equal to the time delay provided by from MPL biphase amplifier limiter/inverter 412) is applied as an input to the upper end of coupler 414. Thus, the upper and lower inputs to coupler 414 have opposite phases. Therefore, the biphase-encoded amplitude power $\Delta_K$ derived at the midpoint of coupler 414 is determined by the difference in peak amplitudes of the inputs to the upper and lower ends of coupler 414 and the relative phase of $\Delta_K$ will be the same as the phase of that one the upper and lower inputs to coupler 414 that has the larger peak amplitude.

The following table shows the respective values of $\Delta_0$, $\Delta_1$, $\Delta_2$, $\Delta_3$ and $\Delta_4$, for $\Delta_0$ having a biphase-encoded normalized amplitude between −1 and +1.

| $\Delta_0$ Value | $\Delta_1$ Value | $\Delta_2$ Value | $\Delta_3$ Value | $\Delta_4$ Value |
|---|---|---|---|---|
| $+15/16 < \Delta_0 \leq +1$ | $+7/16 < \Delta_1 \leq +1/2$ | $+3/16 < \Delta_2 \leq +1/4$ | $+1/16 < \Delta_3 \leq +1/8$ | $0 < \Delta_3 \leq +1/16$ |
| $+7/8 < \Delta_0 \leq +15/16$ | $+3/8 < \Delta_1 \leq +7/16$ | $+1/8 < \Delta_2 \leq +3/16$ | $0 < \Delta_3 \leq +1/16$ | $-1/16 < \Delta_3 \leq 0$ |
| $+13/16 < \Delta_0 \leq +7/8$ | $+5/16 < \Delta_1 \leq +3/8$ | $+1/16 < \Delta_2 \leq +1/8$ | $-1/16 < \Delta_3 \leq 0$ | $0 < \Delta_3 \leq +1/16$ |
| $+3/4 < \Delta_0 \leq +13/16$ | $+1/4 < \Delta_1 \leq +5/16$ | $0 < \Delta_2 \leq +1/16$ | $-1/8 < \Delta_3 \leq -1/16$ | $-1/16 < \Delta_3 \leq 0$ |
| $+11/16 < \Delta_0 \leq +3/4$ | $+3/16 < \Delta_1 \leq +1/4$ | $-1/16 < \Delta_2 \leq 0$ | $+1/16 < \Delta_3 \leq +1/8$ | $0 < \Delta_3 \leq +1/16$ |
| $+5/8 < \Delta_0 \leq +11/16$ | $+1/8 < \Delta_1 \leq +3/16$ | $-1/8 < \Delta_2 \leq -1/16$ | $0 < \Delta_3 \leq +1/16$ | $-1/16 < \Delta_3 \leq 0$ |
| $+9/16 < \Delta_0 \leq +5/8$ | $+1/16 < \Delta_1 \leq +1/8$ | $-3/16 < \Delta_2 \leq -1/8$ | $-1/16 < \Delta_3 \leq 0$ | $0 < \Delta_3 \leq +1/16$ |
| $+1/2 < \Delta_0 \leq +9/16$ | $0 < \Delta_1 \leq +1/16$ | $-1/4 < \Delta_2 \leq -3/16$ | $-1/8 < \Delta_3 \leq -1/16$ | $-1/16 < \Delta_3 \leq 0$ |
| $+7/16 < \Delta_0 \leq +1/2$ | $-1/16 < \Delta_1 \leq 0$ | $+3/16 < \Delta_2 \leq +1/4$ | $+1/16 < \Delta_3 \leq +1/8$ | $0 < \Delta_3 \leq +1/16$ |
| $+3/8 < \Delta_0 \leq +7/16$ | $-1/8 < \Delta_1 \leq -1/16$ | $+1/8 < \Delta_2 \leq +3/16$ | $0 < \Delta_3 \leq +1/16$ | $-1/16 < \Delta_3 \leq 0$ |
| $+5/16 < \Delta_0 \leq +3/8$ | $-3/16 < \Delta_1 \leq -1/8$ | $+1/16 < \Delta_2 \leq +1/8$ | $-1/16 < \Delta_3 \leq 0$ | $0 < \Delta_3 \leq +1/16$ |
| $+1/4 < \Delta_0 \leq +5/16$ | $-1/4 < \Delta_1 \leq -3/16$ | $0 < \Delta_2 \leq +1/16$ | $-1/8 < \Delta_3 \leq -1/16$ | $-1/16 < \Delta_3 \leq 0$ |
| $+3/16 < \Delta_0 \leq +1/4$ | $-5/16 < \Delta_1 \leq -1/4$ | $-1/16 < \Delta_2 \leq 0$ | $+1/16 < \Delta_3 \leq +1/8$ | $0 < \Delta_3 \leq +1/16$ |
| $+1/8 < \Delta_0 \leq +3/16$ | $-3/8 < \Delta_1 \leq -5/16$ | $-1/8 < \Delta_2 \leq -1/16$ | $0 < \Delta_3 \leq +1/16$ | $-1/16 < \Delta_3 \leq 0$ |
| $+1/16 < \Delta_0 \leq +1/8$ | $-7/16 < \Delta_1 \leq -3/8$ | $-3/16 < \Delta_2 \leq -1/8$ | $-1/16 < \Delta_3 \leq 0$ | $0 < \Delta_3 \leq +1/16$ |
| $0 < \Delta_0 \leq +1/16$ | $-1/2 < \Delta_1 \leq -7/16$ | $-1/4 < \Delta_2 \leq -3/16$ | $-1/8 < \Delta_3 \leq -1/16$ | $-1/16 < \Delta_3 \leq 0$ |
| $-1/16 \leq \Delta_0 < 0$ | $+7/16 \leq \Delta_1 < +1/2$ | $+3/16 \leq \Delta_2 < +1/4$ | $+1/16 < \Delta_3 \leq +1/8$ | $0 < \Delta_3 \leq +1/16$ |
| $-1/8 \leq \Delta_0 < -1/16$ | $+3/8 \leq \Delta_1 < +7/16$ | $+1/8 \leq \Delta_2 < +3/16$ | $0 < \Delta_3 \leq +1/16$ | $-1/16 < \Delta_3 \leq 0$ |
| $-3/16 \leq \Delta_0 < -1/8$ | $+5/16 \leq \Delta_1 < +3/8$ | $+1/16 \leq \Delta_2 < +1/8$ | $-1/16 < \Delta_3 \leq 0$ | $0 < \Delta_3 \leq +1/16$ |
| $-1/4 \leq \Delta_0 < -3/16$ | $+1/4 \leq \Delta_1 < +5/16$ | $0 < \Delta_2 \leq +1/16$ | $-1/8 < \Delta_3 \leq -1/16$ | $-1/16 < \Delta_3 \leq 0$ |
| $-5/16 \leq \Delta_0 < -1/4$ | $+3/16 \leq \Delta_1 < +1/4$ | $-1/16 \leq \Delta_2 < 0$ | $+1/16 < \Delta_3 \leq +1/8$ | $0 < \Delta_3 \leq +1/16$ |
| $-3/8 \leq \Delta_0 < -5/16$ | $+1/8 \leq \Delta_1 < +3/16$ | $-1/8 \leq \Delta_2 < -1/16$ | $0 < \Delta_3 \leq +1/16$ | $-1/16 < \Delta_3 \leq 0$ |
| $-7/16 \leq \Delta_0 < -3/8$ | $+1/16 \leq \Delta_1 < +1/8$ | $-3/16 \leq \Delta_2 < -1/8$ | $-1/16 < \Delta_3 \leq 0$ | $0 < \Delta_3 \leq +1/16$ |

-continued

| $\Delta_0$ Value | $\Delta_1$ Value | $\Delta_2$ Value | $\Delta_3$ Value | $\Delta_4$ Value |
|---|---|---|---|---|
| $-\frac{1}{2} \leq \Delta_0 < -\frac{7}{16}$ | $0 \leq \Delta_1 < +\frac{1}{16}$ | $-\frac{1}{4} \leq \Delta_2 < -\frac{3}{16}$ | $-\frac{1}{8} < \Delta_3 \leq -\frac{1}{16}$ | $-\frac{1}{16} < \Delta_3 \leq 0$ |
| $-\frac{9}{16} \leq \Delta_0 < -\frac{1}{2}$ | $-\frac{1}{16} \leq \Delta_1 < 0$ | $+\frac{3}{16} \leq \Delta_2 < +\frac{1}{4}$ | $+\frac{1}{16} < \Delta_3 \leq +\frac{1}{8}$ | $0 < \Delta_3 \leq +\frac{1}{16}$ |
| $-\frac{5}{8} \leq \Delta_0 < -\frac{9}{16}$ | $-\frac{1}{8} \leq \Delta_1 < -\frac{1}{16}$ | $+\frac{1}{8} \leq \Delta_2 < +\frac{3}{16}$ | $0 < \Delta_3 \leq +\frac{1}{16}$ | $-\frac{1}{16} < \Delta_3 \leq 0$ |
| $-\frac{11}{16} \leq \Delta_0 < -\frac{5}{8}$ | $-\frac{3}{16} \leq \Delta_1 < -\frac{1}{8}$ | $+\frac{1}{16} \leq \Delta_2 < +\frac{1}{8}$ | $-\frac{1}{16} < \Delta_3 \leq 0$ | $0 < \Delta_3 \leq +\frac{1}{16}$ |
| $-\frac{3}{4} \leq \Delta_0 < -\frac{11}{16}$ | $-\frac{1}{4} \leq \Delta_1 < -\frac{3}{16}$ | $0 \leq \Delta_2 < +\frac{1}{16}$ | $-\frac{1}{8} < \Delta_3 \leq -\frac{1}{16}$ | $-\frac{1}{16} < \Delta_3 \leq 0$ |
| $-\frac{13}{16} \leq \Delta_0 < -\frac{3}{4}$ | $-\frac{5}{16} \leq \Delta_1 < -\frac{1}{4}$ | $-\frac{1}{16} \leq \Delta_2 < 0$ | $+\frac{1}{16} < \Delta_3 \leq +\frac{1}{8}$ | $0 < \Delta_3 \leq +\frac{1}{16}$ |
| $-\frac{7}{8} \leq \Delta_0 < -\frac{13}{16}$ | $-\frac{3}{8} \leq \Delta_1 < -\frac{5}{16}$ | $-\frac{1}{8} \leq \Delta_2 < -\frac{1}{16}$ | $0 < \Delta_3 \leq +\frac{1}{16}$ | $-\frac{1}{16} < \Delta_3 \leq 0$ |
| $-\frac{15}{16} \leq \Delta_0 < -\frac{7}{8}$ | $-\frac{7}{16} \leq \Delta_1 < -\frac{3}{8}$ | $-\frac{3}{16} \leq \Delta_2 < -\frac{1}{8}$ | $-\frac{1}{16} < \Delta_3 \leq 0$ | $0 < \Delta_3 \leq +\frac{1}{16}$ |
| $-1 \leq \Delta_0 < -\frac{15}{16}$ | $-\frac{1}{2} \leq \Delta_1 < -\frac{7}{16}$ | $-\frac{1}{4} \leq \Delta_2 < -\frac{3}{16}$ | $-\frac{1}{8} < \Delta_3 \leq -\frac{1}{16}$ | $-\frac{1}{16} < \Delta_3 \leq 0$ |

More particularly, in the above table, "+" is indicative of those biphase-encoded, amplitude-modulated carrier values of $\Delta_0$, $\Delta_1$, $\Delta_2$, $\Delta_3$ and $\Delta_4$ which have a given phase, e.g., 0°, and "−" is indicative of those biphase-encoded, amplitude-modulated carrier values of $\Delta_0$, $\Delta_1$, $\Delta_2$, $\Delta_3$ and $\Delta_4$ which have a phase opposite to this given phase, e.g., 180°. Generalizing from the value ranges for $\Delta_0$, $\Delta_1$, $\Delta_2$, $\Delta_3$ and $\Delta_4$ shown in the above table, it becomes apparent that the value ranges for $\Delta_0$, $\Delta_1$, $\Delta_2$, $\Delta_3$, $\Delta_4 \ldots \Delta_{N-1}$ (e.g., −1 to +1 for $\Delta_0$) asymptotically approach zero as the value range for $\Delta_{N-1}$ is approached.

Figure 4B:
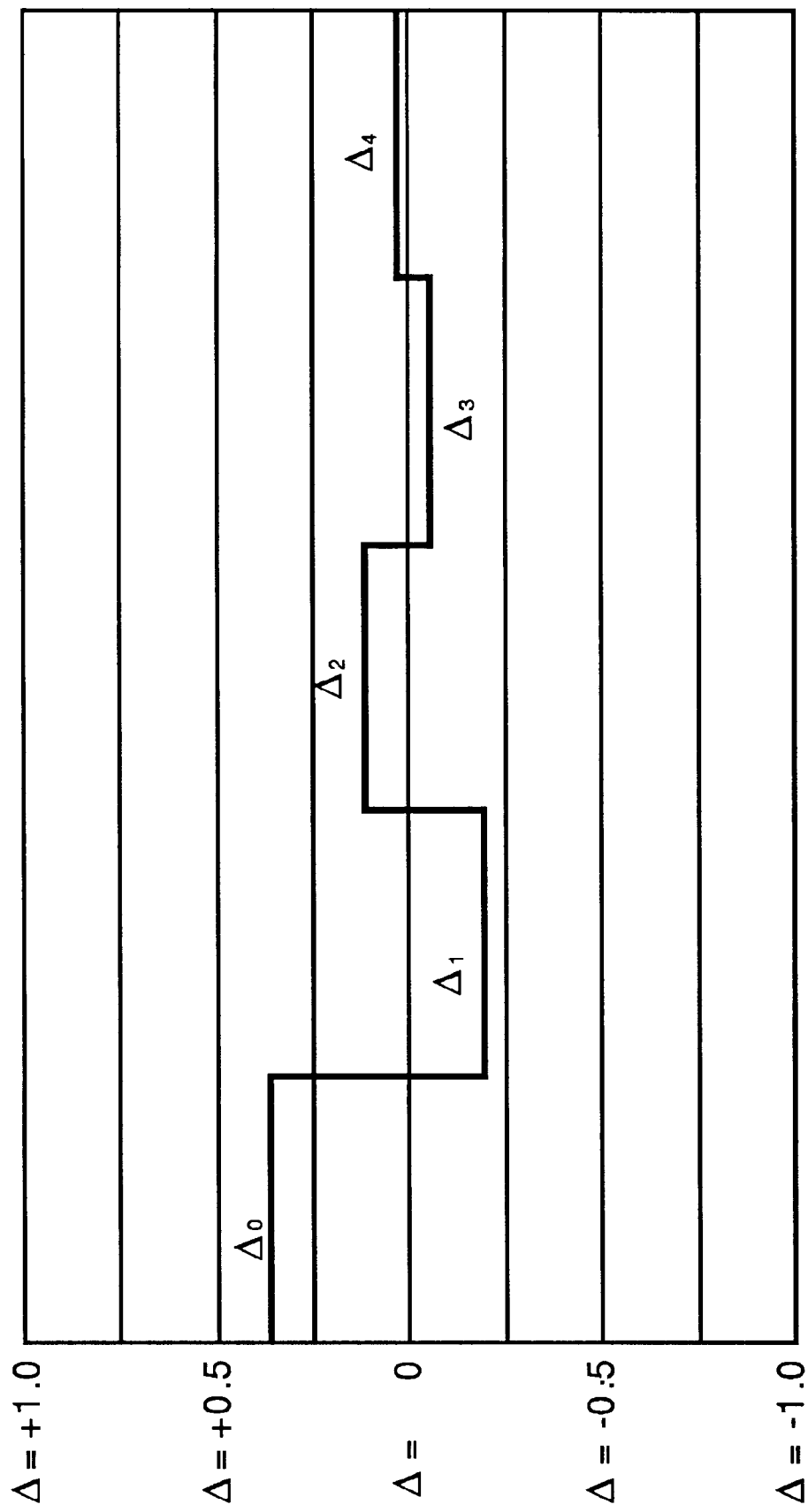
FIG. 4b is a graph showing the relationship among the amplitudes for the input to the first differential comparator and the outputs of each of the first four differential comparators of FIG. 4 for the assumed example in which the input to the first differential comparator has a normalized amplitude of +0.33.

For illustrative purposes, FIG. 4b is a graph exemplifying the relationship among $\Delta_0 \ldots \Delta_4$ for the particular case in which the information signal $\Delta_0$ has a normalized amplitude of +0.33. The similarity between the asymptotic approach toward zero shown in the graph of FIG. 4b and the asymptotic approach toward −S shown in the graph of FIG. 3b is obvious. Thus, the accuracy of the respective differential comparators of FIG. 4 can be determined by checking whether or not the value of the $\Delta_N$ output from the Nth MSB differential comparator differs from zero by no more than the very small amount of $$\pm \frac{1}{2^N}.$$

This is an important advantage because it simplifies the otherwise very difficult measurement process for checking the accuracy of the respective differential comparators of FIG. 4 for an amplitude-modulated input information signal $\Delta_0$ with multi-gigahertz components.

Biphase amplitude modulators 200, 300 and 400, MPL biphase amplifier limiter/inverters 212, 312, 412, 912 and 1012, the portion of sample clock(s) 104 for deriving output sample clock $CL_o$ and S/H 102-1 to 102-N (shown in FIGS. 1, 2, 2a, 3, 3a, 4, 4a, 9 and/or 10) are preferably all implemented with MPL circuits (shown in FIGS. 5, 5a, 6a, 6b, 7a, 7b, 8, 9a, 10 and/or 10a) that employ doubly-balanced mixers.

FIG. 5 shows (with the exception of the optional sampling of the input signal) a first preferable implementation for each of modulators 200, 300 and 400. In FIG. 5, an analog signal of a given polarity and magnitude, after first being combined in D.C. bias "T" 500-1 with a D.C. bias voltage of magnitude +V, is forwarded as a first modulating signal input to doubly-balanced mixer 5021, and a termination to ground (i.e., a zero-magnitude signal), after first being combined in D.C. bias "T" 500-2 with a D.C. bias voltage of magnitude −V, is forwarded as a second modulating signal input to doubly-balanced mixer 502-2. Coupler 504 divides pump P carrier frequency $f_c$ applied to its midpoint into (1) a first output from its upper end that is forwarded as a local-oscillator input to doubly-balanced mixer 502-1 and (2) a second output from its lower end that is forwarded as a local-oscillator input to doubly-balanced mixer 502-2.

Doubly-balanced mixer 502-1 derives a first modulated-carrier output that is forwarded through variable phase shifter (P. S.) 5061 as an input to the upper end of coupler 508, and doubly-balanced mixer 502-1 derives a second modulated-carrier output that is forwarded through variable phase shifter 506-2 as an input to the lower end of coupler 508. Phase shifter 5061 is adjusted so that the first modulated-carrier input to the upper end of coupler 508 is a biphase-encoded signal that has a peak amplitude proportional to the algebraic sum of the magnitude of the analog signal and the magnitude +V bias voltage and a certain phase (e.g., 0° or 180°) determined by the polarity of that one of the analog signal and the +V bias voltage that has the larger magnitude. Phase shifter 506-2 is adjusted so that the second modulated-carrier input to the lower end of coupler 508 is a biphase-encoded signal that has a peak amplitude proportional solely to the magnitude of the −V bias voltage and a phase (e.g., 180°) determined solely by the minus polarity of the −V bias voltage. Coupler 508 derives an output at its midpoint that is substantially equal to the algebraic sum of the inputs to its upper and lower ends. Therefore, the output from the midpoint of coupler 508 is a biphase-encoded, modulated-carrier having a peak amplitude proportional solely to the magnitude of the analog signal and a phase (e.g., 0° or 180°) determined solely by the polarity of the analog signal. The purpose of the +V and −V bias voltages is to insure that the peak-to-peak amplitude of the biphase-encoded, modulated-carrier output from the midpoint of coupler 508 is symmetrically situated with respect to a virtual ground (i.e., zero) voltage level. However, it should be understood that, if desired, a second analog signal, instead of a termination to ground, can be combined in D.C. bias "T" 500-2 with the D.C. bias voltage of magnitude −V before being forwarded as a second modulating signal input to doubly-balanced mixer 502-2. In this latter case, the output from the midpoint of coupler 508 is a biphase-encoded, modulated-carrier having a peak amplitude proportional to an analog signal having a magnitude equal to the algebraic sum of the respective magnitudes of the first and second analog signals and a phase determined by the polarity of the larger-magnitude one of the first and second analog signals.

More specifically, FIG. 5a shows a second preferable implementation for each of modulators 200, 300 and 400 in which the analog signal is coupled to D.C. bias "T" 500-1 through capacitance 501-1 and is coupled to D.C. bias "T" 500-2 through capacitance 501-2. Thus, the FIG. 5a inplementation differs from that of the above-described FIG. 5 implementation only in that in FIG. 5athe same analog signal which is combined in D.C. bias "T" 500-1 with the D.C. bias voltage of magnitude +V is also combined in D.C. bias "T" 500-2 with the D.C. bias voltage of magnitude −V. The respective magnitudes +V and −V are chosen so that each of doubly-balanced mixers 502-1 and 502-2 is biased to its linear region. When the applied analog signal is positive, the current through doubly-balanced mixer 502-1 is increased and the current through doubly-balanced mixer 502-2 is decreased. Similarly, when the applied analog signal is negative, the current through doubly-balanced mixer 502-1 is decreased and the current through doubly-balanced mixer 502-2 is increased. As a result, the effects of non-linearities in the voltage-current characteristics of doubly-balanced mixers 502-1 and 502-2 tend to be balanced out. Thus, the modulated output at the midpoint of coupler 508 in FIG. 5a is a more linear function of the amplitude of the input analog signal than it is in the case shown in FIG. 5 where the D.C. bias voltage of magnitude −V is combined in D.C. bias "T" 500-2 with a termination to ground.

Figure 6A:
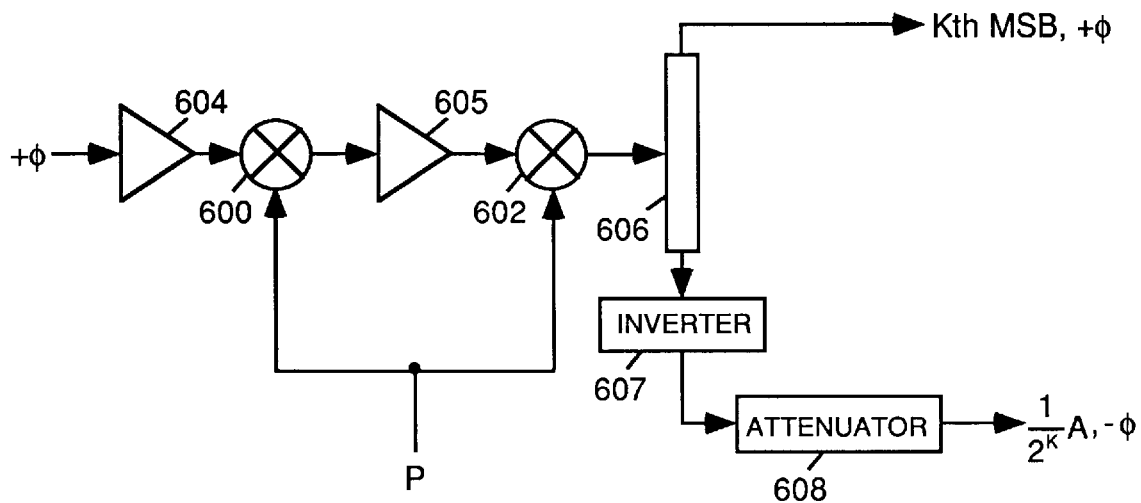
FIGS. 6a and 6b, respectively, schematically show first and second alternative embodiments of the amplifier limiter/inverter employed by each of FIGS. 2a, 3a and 4a, each of which alternative embodiments incorporates doubly-balanced mixers.
Figure 6B:
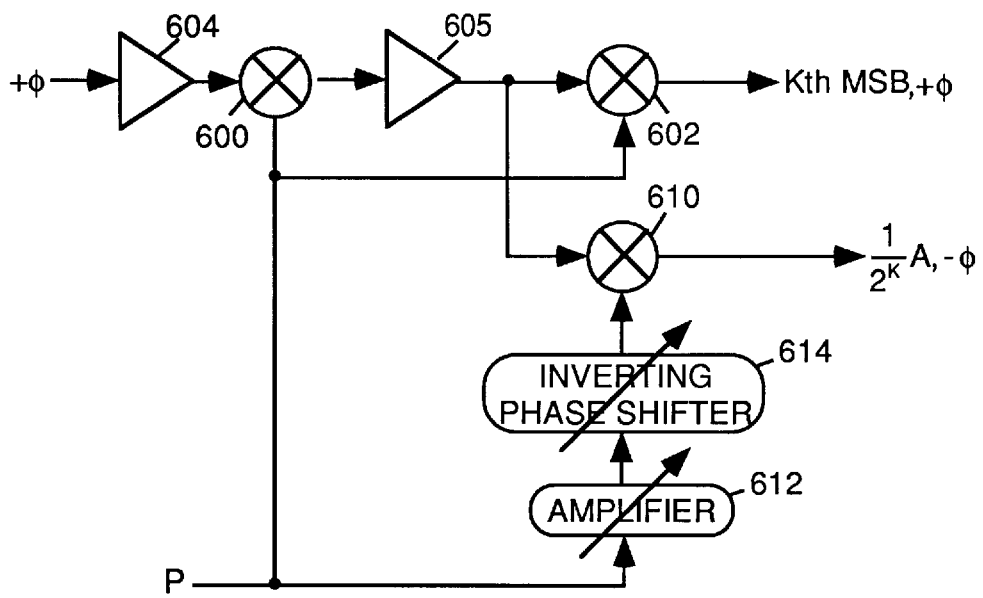
Figure 9:
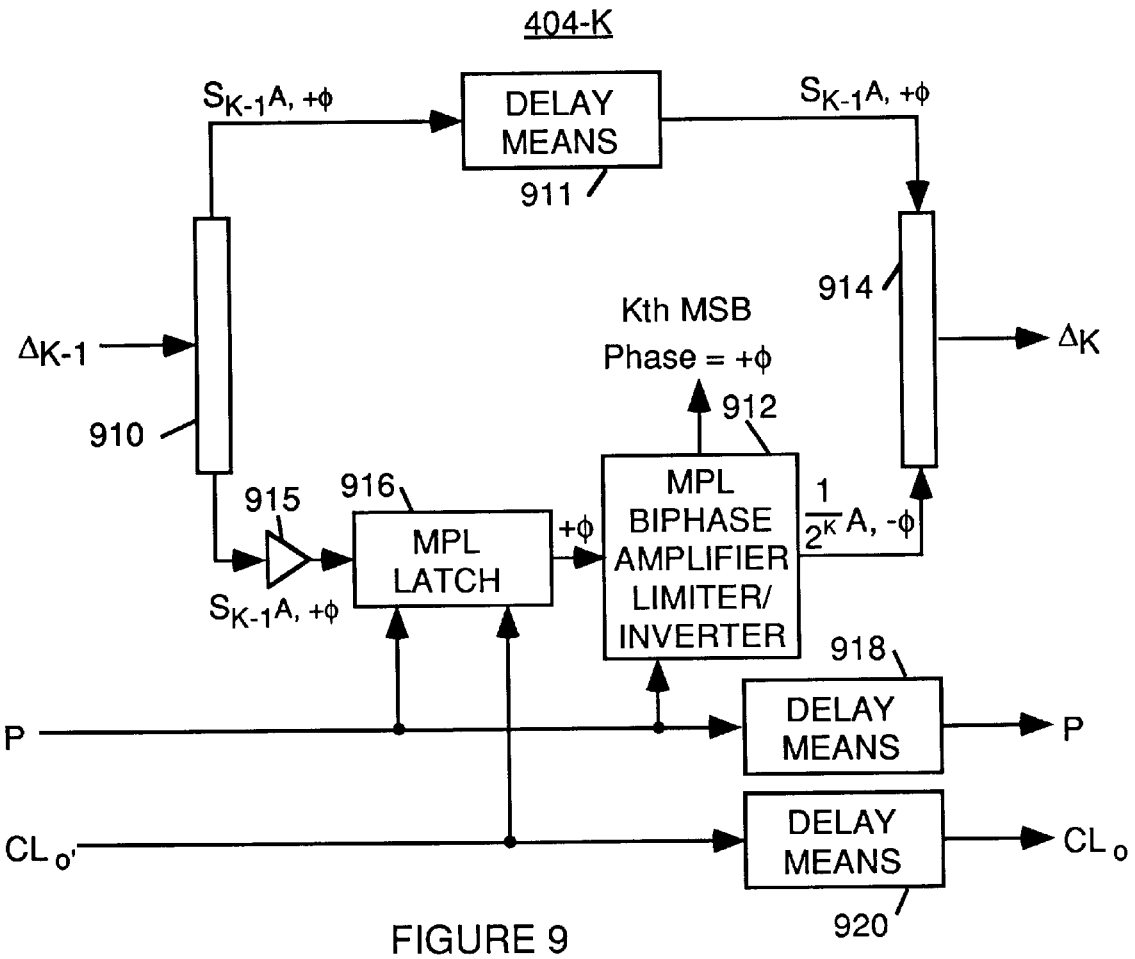
FIG. 9 shows a first alternative structure for the differential comparators of the third species of an N-bit analog to biphase-encoded A/D converter, wherein each of the differential comparators includes a sampled latch.

FIGS. 6a and 6b schematically show first and second alternative embodiments of MPL biphase amplifier limiter/inverters 212 of FIG. 2a, 312 of FIG. 3a, 412 of FIG. 4a and 912 of FIG. 9.

Referring to FIG. 6a, the pump P carrier frequency $f_c$ is applied as a local-oscillator input to each of doubly-balanced mixer 600 (which operates as a demodulator) and doubly-balanced mixer 602 (which operates as a modulator). The biphase-encoded, modulated signal input (having a relative phase of +φ) to the MPL biphase amplifier limiter/inverter is applied as an input to from high-gain amplifier 604. The magnitude of the biphase-encoded, modulated signal output from high-gain amplifier 604, which is applied as a signal input to doubly-balanced mixer 600, is sufficient to overdrive mixer 600 by an amount which makes the output from mixer 600 substantially independent of the amplitude of the signal input thereto. Therefore, mixer 600, operating as a demodulator, derives a substantially fixed magnitude baseband signal at its output that has a positive or negative polarity determined solely by the relative +φ phase value at that time of the biphase-encoded, modulated signal output from high-gain amplifier 604. This baseband signal, preferably after further amplification by baseband amplifier 605, is applied as a modulating-signal input to doubly-balanced mixer 602. Mixer 602, operating as a modulator, derives a substantially fixed amplitude, biphase-encoded signal at its output that has a relative phase +φ determined solely by the polarity at that time of the modulating-signal input to mixer 602. Therefore, modulator doubly-balanced mixer 602 derives a biphase-encoded signal output having a +φ relative phase and a first certain fixed amplitude. This biphase-encoded signal output from modulator doubly-balanced mixer 602 is applied to the midpoint of coupler 606, resulting in the Kth MSB output from the MPL biphase amplifier limiter/inverter being derived at the upper end of coupler 606 with a +φ relative phase and a second certain fixed amplitude. The $$\frac{1}{2^K}A,$$

−φ output from the MPL biphase amplifier limiter/inverter is derived by (1) employing inverter 607 to invert the +φ relative phase output at the lower end of coupler to obtain a −φ relative phase signal having an A-valued fixed amplitude and (2) employing attenuator 608 to attenuate the inverted signal by an amount equal to $$\frac{1}{2^K}.$$

It should be noted that in the first alternative embodiment, shown in FIG. 6a described above, the biphase-encoded output signal from mixer 602 is normally a microwave signal having a broad bandwidth. In practice, this increases the complexity of the circuitry used to implement attenuator 608 in a manner which achieves with precision the desired $$\frac{1}{2^K}A$$

attenuation over this broad bandwidth. The second alternative embodiment, shown in FIG. 6b avoids the need for using both a broad bandwidth signal and an attenuator to derive a biphase-encoded output from the MPL biphase amplifier limiter/inverter having a relative phase −φ and a fixed peak amplitude of $$\frac{1}{2^K}A.$$

Specifically, the second alternative embodiment, shown in FIG. 6b, like the first alternative embodiment, shown in FIG. 6a, employs doubly-balanced mixers 600 and 602 and high-gain and baseband amplifiers 604 and 605 to derive the Kth MSB output of the MPL biphase amplifier limiter/inverter. However, the second alternative embodiment includes an additional doubly-balanced mixer 610, operating as a second modulator, that is employed in the derivation of the biphase-encoded output from the MPL biphase amplifier limiter/inverter having a relative phase −φ and a fixed peak amplitude of $$\frac{1}{2^K}A.$$

More particularly, the baseband output signal from demodulator mixer 600 that, after being amplified by baseband amplifier 605, is applied as a modulating-signal input to modulator mixer 602, is also applied as a modulating-signal input to modulator mixer 610. However, the pump P carrier frequency $f_c$ (which is a tone that exhibits a very narrow bandwidth) is forwarded as a local-oscillator input to modulator mixer 610 through variable amplifier 612 and variable inverting phase shifter 614. The settings of variable amplifier 612 and variable inverting phase shifter 614 determine the peak amplitude and phase value of the local oscillator input of modulator mixer 610. Then, the peak amplitude and phase value of this local oscillator input to mixer 610 along with the fixed amplitude and polarity of the modulating-signal input to modulator mixer 610 determine the peak amplitude and phase value of the output from modulator mixer 610. Since the fixed amplitude and polarity of the modulating-signal input to modulator mixer 610 are the same as the fixed amplitude and polarity of the modulating-signal input to modulator mixer 602, the settings of variable amplifier 612 and variable phase shifter 614 can be adjusted so that the output from modulator mixer 610 has a fixed peak amplitude of $$\frac{1}{2^K}A$$

and a relative phase of $-\phi$ with respect to the relative phase of $+\phi$ of the input to the MPL biphase amplifier limiter/inverter.

Figure 7A:
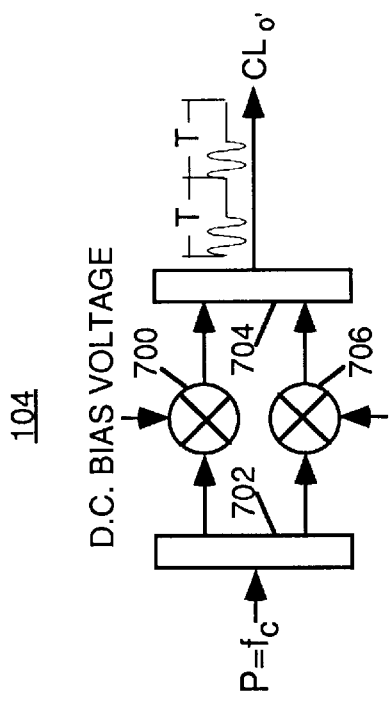
FIG. 7a schematically shows a first preferred embodiment, incorporating doubly-balanced mixers, of the portion of the timing circuitry of the sample clock(s) of FIG. 1 for deriving the output sample clock for use with the respective structures shown in FIG. 8 and FIG. 9.
Figure 7B:
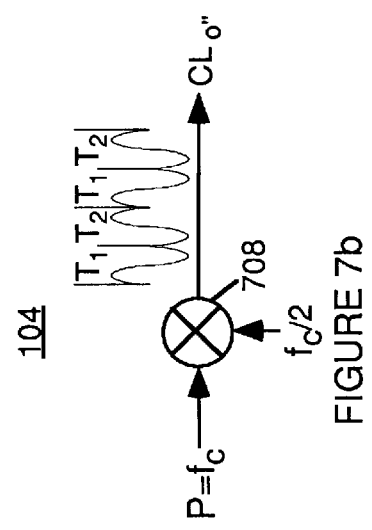
FIG. 7b schematically shows a second preferred embodiment, incorporating doubly-balanced mixers, of the portion of the timing circuitry of the sample clock(s) of FIG. 1 for deriving the output sample clock for use with the structure shown in FIG. 10.

FIGS. 7a and 7b, respectively, schematically show first and second species of a portion of the timing circuitry of sample clock(s) 104 of FIG. 1. The first species shown in FIG. 7a is suitable for deriving an output sample clock $CL_o$) for use with both a sample-and hold embodiment, schematically shown in FIG. 8, that is preferably employed for each of the above-described S/H means 102-1 to 102-N of FIG. 1 and the MPL latch of the below-described embodiment of FIG. 9. The second species shown in FIG. 7b is suitable for deriving an output sample clock $CL_o$" for use with the MPL latch of the below-described embodiment of FIG. 10.

Referring to FIG. 7a, doubly-balanced mixer 700, operating as a modulator, modulates pump P carrier frequency $f_c$, forwarded thereto through coupler 702, with a D.C. bias voltage. The output from mixer 700, which is a carrier frequency $f_c$ having a first peak amplitude determined by the magnitude of the modulating D.C. bias voltage, is applied as a first input to coupler 704. Doubly-balanced mixer 706, operating as a modulator, modulates pump P carrier frequency $f_c$, forwarded thereto through coupler 702, with a subharmonic frequency $f_c/4$ of the pump P carrier frequency $f_c$. Subharmonic frequency $f_c/4$ is derived by means, not shown, of the timing circuitry of sample clock(s) 104. The output from mixer 706, which is a carrier frequency $f_c$ having a second peak amplitude and phase value determined by the peak amplitude and phase value of the subharmonic frequency $f_c/4$ is applied as a second input to coupler 704. Thus, the respective first and second inputs to coupler 704 will have the same phases during each positive half-cycle of subharmonic frequency $f_c/4$ and 704 will have opposite phases during each negative half-cycle of subharmonic frequency $f_c/4$. The magnitude of the modulating D.C. bias voltage is adjusted so that the first and second peak amplitudes of the respective first and second inputs to coupler 704 are substantially equal to one another. As graphically shown in FIG. 7a, this results in the combination of the first and second inputs to coupler 704, appearing as the $CL_o$, output sample clock therefrom, comprising 2 cycles of carrier frequency $f_c$ during the first half of each successive $CL_o$, output sample clock period T, followed by zero during the second half of each successive $CL_o$, output sample clock period T (where each period T of the output sample clock $CL_o$, is equal to the period of the subharmonic frequency $f_c/4$).

Referring to FIG. 7b, doubly-balanced mixer 708, operating as a modulator, sinusoidally modulates pump P carrier frequency $f_c$ with a subharmonic frequency $f_c/2$ of the pump P carrier frequency $f_c$. Subharmonic frequency $f_c/2$ is derived by means, not shown, of the timing circuitry of sample clock(s) 104. As graphically shown in FIG. 7b, the modulated output from doubly-balanced mixer 708, which appears as the $CL_o$" output sample clock therefrom, comprises 1 cycle of carrier frequency $f_c$ having a given phase during each positive half-cycle of subharmonic frequency $f_c/2$ (broadly designated a given proper fraction $T_1$ of each output sample period) and 1 cycle of carrier frequency $f_c$ having a phase opposite to this given phase during each negative half-cycle of subharmonic frequency $f_c/$ (broadly designated a remaining fraction $T_3$ of each output sample period).

Figure 8:
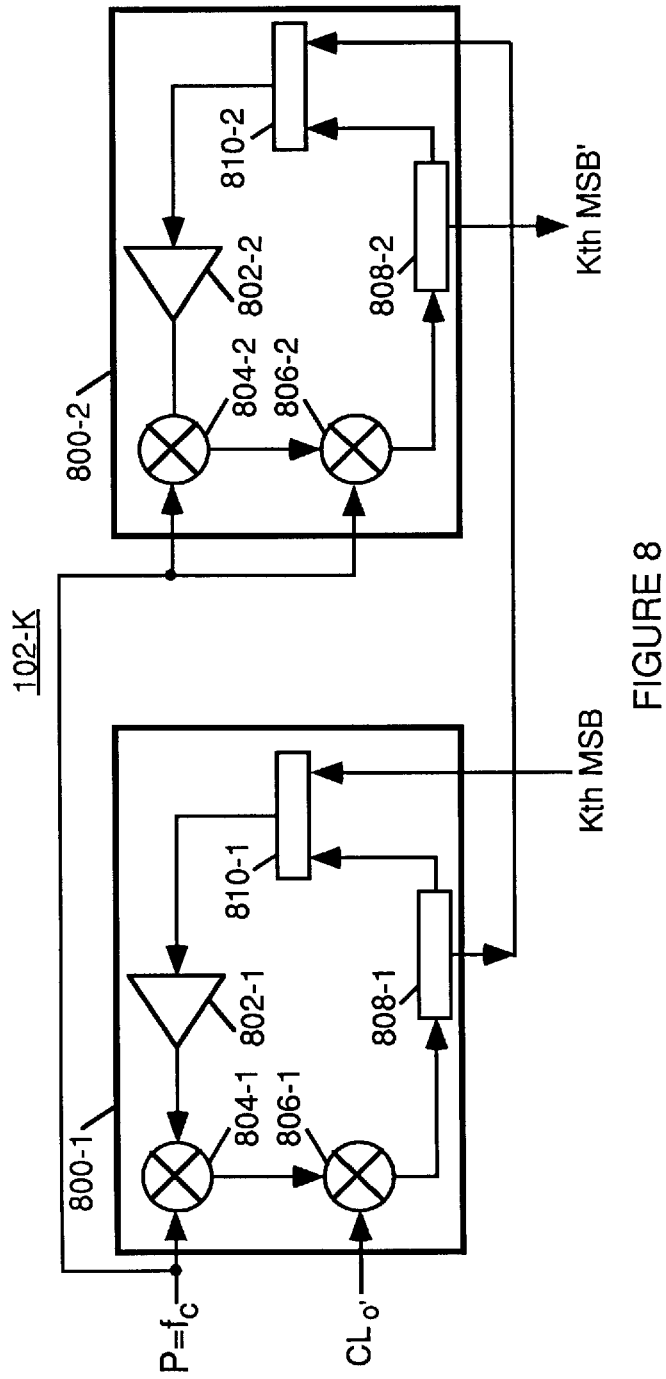
FIG. 8 schematically shows a preferred embodiment of the memories, incorporating doubly-balanced mixers, of each S/H of FIG. 1.

Referring to FIG. 8, S/H 102-K comprises structurally similar first and second closed-loop memories 800-1 and 800-2. Specifically, closed-loop memory 800-1 is made up of amplifier 802-1, doubly-balanced mixer 804-1, doubly-balanced mixer 8061, coupler 808-1 and coupler 810-1; while second closed-loop memory 800-2 is made up of amplifier 802-2, doubly-balanced mixer 804-2, doubly-balanced mixer 806-2, coupler 808-2 and coupler 810-2. The closed loop of each of these two 800 memories comprises (1) the output of its 802 amplifier applied to the signal input of its 804 doubly-balanced mixer (which operates as a demodulator), (2) the output of its 804 doubly-balanced mixer applied to the signal input of its 806 doubly-balanced mixer (which operates as a modulator), (3) the output of its 806 doubly-balanced mixer applied to the input of its 808 coupler, (4) a first output of its 808 coupler applied as a first input to its 810 coupler, and (5) the output of its 810 coupler applied as an input to its 804 amplifier. Pump P carrier frequency $f_c$, is applied, respectively, as the carrier input of doubly-balanced mixer 804-1 of closed-loop memory 800-1 and each of doubly-balanced mixers 804-2 and 806-2 of closed-loop memory 800-2, while each successive $CL_o$, output sample clock is applied as the carrier input of doubly-balanced mixer 806-1 of first closed-loop memory 800-1. The Kth MSB output from the Kth comparator of A/D converter 100 is applied as a second input to coupler 810-1 of first closed-loop memory 800-1, while the second output from coupler 808-1 of first closed-loop memory 800-1 is applied as a second input to coupler 810-2 of second closed-loop memory 800-2. The second output from coupler 808-2 of second closed-loop memory 800-2 constitutes the Kth MSB' output from S/H 104-K.

The phase value of the biphase-encoded signal applied as an input to amplifier 802-1 of first closed-loop memory 800-1 is determined by the phase value of that one the biphase signals applied to the first and second inputs of coupler 810-1 which has the higher peak amplitude. Similarly, the phase value of the biphase-encoded signal applied as an input to amplifier 802-2 of second closed-loop memory 800-2 is determined by the phase value of that one the biphase signals applied to the first and second inputs of coupler 810-2 which has the higher peak amplitude. During the zero-level half-period of each successive $CL_o$, output sample clock, a zero-amplitude output from modulator mixer 806-1 is forwarded through coupler 808-1 to both the first input of coupler 810-1 and the second input of coupler 810-2. In this case, the current phase value of the Kth MSB biphase-encoded signal applied to the second input of coupler 810-1 determines the phase value of the closed-loop recirculated biphase-encoded output from modulator mixer 806-1 during the next following non-zero-level half-period of each successive $CL_o$, output sample clock. Further, the peak amplitude of the non-zero-level biphase-encoded output from modulator mixer 806-1 (determined by the peak amplitude of the $CL_o$, output sample clock) is higher than both the peak amplitude of the Kth MSB biphase-encoded signal and the peak amplitude of the closed-loop recirculated biphase-encoded output from modulator mixer 806-2. Therefore, (1) in the case of the first closed-loop memory 800-1, the phase value of the recirculated biphase-encoded output from modulator mixer 8061 cannot change until the occurrence of the next following zero-level half-period $CL_o$, output sample clock and (2) in the case of the second closed-loop memory 800-2, the phase value of the Kth MSB' output from coupler 808-2 (which constitutes the biphase-encoded Kth MSB' signal's output phase value from S/H 102-K) is determined by the phase value of the recirculated biphase-encoded output from modulator mixer 806-1 forwarded as the second input to coupler 810-2 during the non-zero-level half-period of each successive $CL_{O'}$ output sample clock (which output phase value of the biphase-encoded Kth MSB' signal continues without change during the next following zero-level half-period $CL_{O'}$ output sample clock).

Figure 10:
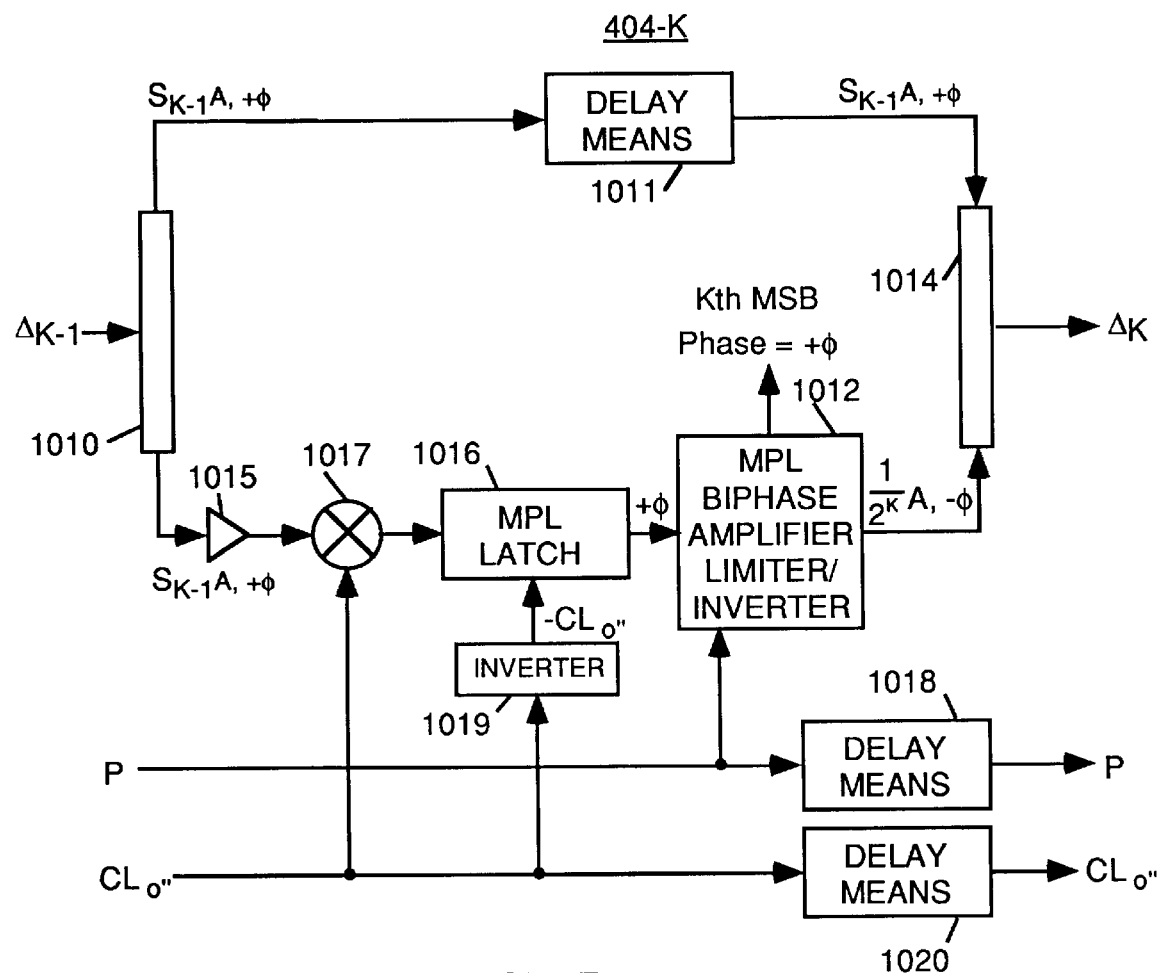
FIG. 10 shows a second alternative structure for the differential comparators of the third species of an N-bit analog to biphase-encoded A/D converter, wherein each of the differential comparators includes a sampled latch.

The need for S/H means 102-1 to 102-N in implementing the third species 100-3 can be avoided by employing either the alternative structure shown in FIG. 9 or the alternative structure shown in FIG. 10 (each of which alternative structures incorporates a sampled MPL latch) for each comparator 404-K, instead of employing the above-described structure shown in FIG. 4*a*.

Figure 9A:
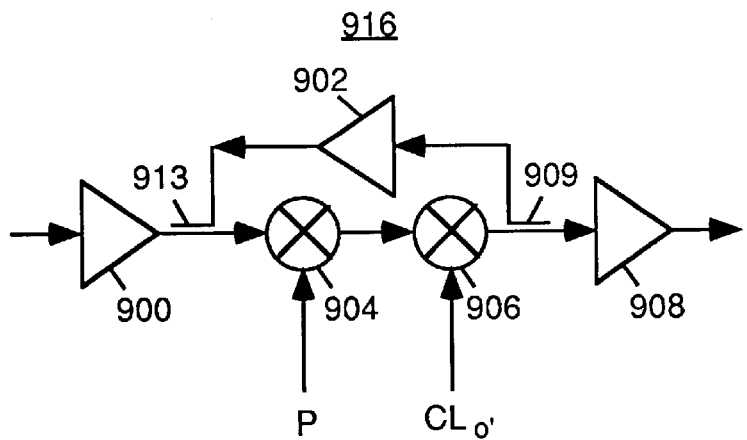
FIG. 9a schematically shows a preferred embodiment of the sampled latch included in each of the differential comparators of FIG. 9.

In the case of the alternative structure shown in FIG. 9, the biphase-encoded, modulated-carrier signal $\Delta_{K-1}$ is applied to the input of coupler 910. The biphase-encoded, modulated-carrier output from the lower end of coupler 910, after being amplified by amplifier 915, is applied as a signal input to sampled MPL latch 916 (a preferred embodiment of which is shown in FIG. 9*a*, discussed below). The output from sampled MPL latch 916 is applied as a signal input to MPL biphase amplifier limiter/inverter 912 (which corresponds in all respects to MPL biphase amplifier limiter/inverter 412 of FIG. 4*a*). The output from MPL biphase amplifier limiter/inverter 912 is applied as a signal input to the lower end of coupler 914. The biphase-encoded, modulated-carrier output from the upper end of coupler 910, after being time delayed by delay means 911 (that provides a time delay which is substantially equal to the total time delay provided by elements 915, 916 and 912), is applied as a signal input to the lower end of coupler 914. The biphase-encoded, modulated-carrier output $\Delta_K$, derived at the midpoint of coupler 914, is forwarded as the biphase-encoded, modulated-carrier signal input to the immediately following comparator 404-(K+1).

As further shown in FIG. 9, pump P carrier frequency $f_c$ is applied as a control input to each of sampled MPL latch 916, MPL biphase amplifier limiter/inverter 912 and delay means 918, and the $CL_{O'}$ output sample clock (derived by sample clock(s) 104 of FIG. 1 as implemented in the manner shown by FIG. 7*a*) is applied as a control input to each of sampled MPL latch 916 and delay means 920. Each of delay means 918 and 920 provides a time delay substantially equal to the total time delay inserted by comparator 404-K in passing the biphase-encoded, modulated-carrier input signal $\Delta_{K-1}$ therethrough to derive the biphase-encoded, modulated-carrier output signal $\Delta_K$ therefrom.

The implementation of sampled MPL latch 916 shown in FIG. 9*a* comprises amplifier 900, demodulator doubly-balanced mixer 904, modulator doubly-balanced mixer 906, amplifier 908, directional coupler 909, amplifier 902 and directional coupler 913. Pump P carrier frequency $f_c$ is applied as the local oscillator input to demodulator doubly-balanced mixer 904, while the $CL_{O'}$ output sample clock is applied as the local oscillator input to modulator doubly-balanced mixer 906. As graphically shown above in FIG. 7*a*, the $CL_{O'}$ output sample clock comprises 2 cycles of carrier frequency $f_c$ during the first half of each successive $CL_{O'}$ output sample clock period T, followed by zero during the second half of each successive $CL_{O'}$ output sample clock period T.

In operation, the biphase-encoded, modulated-carrier input to MPL latch 916, after amplification by amplifier 900 and demodulation by mixer 904, derives a baseband signal having a polarity determined by the current phase of the biphase-encoded, modulated-carrier input to MPL latch 916, which baseband signal is applied as the signal input to modulator mixer 906. During the first half of a current $CL_{O'}$ output sample clock period T, when the $CL_{O'}$ output sample clock comprises 2 cycles of carrier frequency $f_c$, modulator mixer 906 derives a current biphase-encoded, modulated-carrier output (which has a current phase determined by the current polarity of the baseband signal) that is fed back through directional coupler 909, amplifier 902 and directional coupler 913 as the signal input to demodulator mixer 904. Therefore, this current phase persists for the entire first half of a current $CL_{O'}$ output sample clock. However, at the start of the second half of the current $CL_{O'}$ output sample clock period T, when the $CL_{O'}$ output sample clock is zero, the output from modulator mixer 906 becomes zero and the feedback is terminated. Therefore, each successive output sample from modulator mixer 906 which, after amplification by amplifier 908 is applied as an input to MPL biphase amplifier limiter/inverter 912, (1) is a biphase-encoded, modulated-carrier during the first half of each successive sample period that has a phase determined by the then-current phase of the biphase-encoded, modulated-carrier input signal to MPL latch 916 and (2) is zero during the second half of each successive sample period.

Figure 10A:
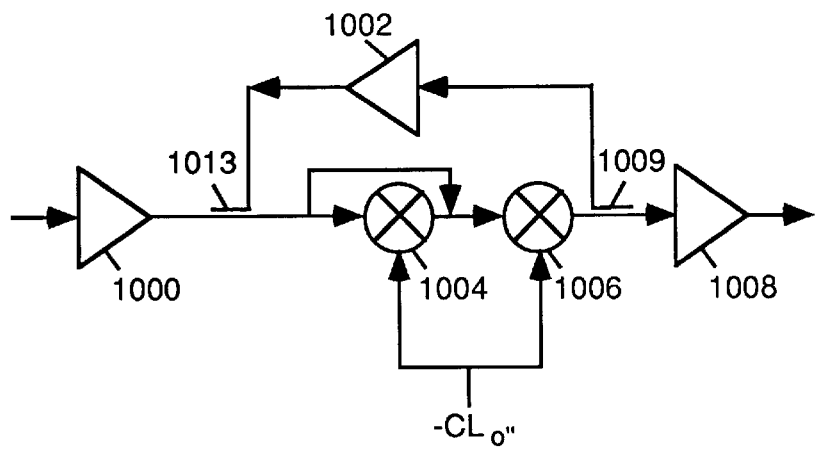
FIG. 10a schematically shows a preferred embodiment of the sampled latch included in each of the differential comparators of FIG. 10.

The alternative structure shown in FIG. 10 differs from the above-described alternative structure shown in FIG. 9 in only three material respects. First, in FIG. 10, the biphase-encoded output of amplifier 1015 (corresponding to amplifier 915 of FIG. 9) is demodulated by doubly-balanced mixer 1017 before being applied to the signal input of sampled MPL latch 1016 (rather than being applied directly to the signal input of sampled MPL latch 916 of FIG. 9). Second, the structure of sampled MPL latch 1016, shown in FIG. 10*a*, is different from the structure of sampled MPL latch 916, shown in FIG. 9*a*. Third, the $CL_{O''}$ output sample clock (derived by sample clock(s) 104 of FIG. 1 implemented in the manner shown by FIG. 7*b*) is applied both to the local oscillator input of doubly-balanced mixer 1017 and through inverter 1019 as the sole control input to sampled MPL latch 1016 (rather than the $CL_{O'}$ output sample clock being applied directly as one of two control inputs to sampled MPL latch 916 and the pump P carrier frequency $f_c$ being applied directly as the other of the two control inputs to sampled MPL latch 916).

In operation, the polarity of the baseband signal output from demodulator mixer 1017 (which is applied as the signal input to MPL latch 1016) is determined both by (1) the current phase of the biphase-encoded, modulated-carrier applied through amplifier 1015 to the signal input of demodulator mixer 1017 and (2) the current phase of the $CL_{O''}$ output sample clock applied as the local oscillator input to demodulator mixer 1017. As graphically shown above in FIG. 7*b*, the $CL_{O''}$ output sample clock comprises 1 cycle of carrier frequency $f_c$ during each $T_1$ fraction of a sample period thereof having a given phase, followed by 1 cycle of carrier frequency $f_c$ during each $T_2$ fraction of a sample period thereof having a phase opposite this given phase. Therefore, whenever the biphase-encoded, modulated-carrier applied to the signal input of demodulator mixer 1017 has this given phase, the polarity of the baseband signal output from demodulator mixer 1017 during a $T_1$ fraction of a sample period will have this given phase and during a $T_2$ fraction of a sample period will have a phase opposite this given phase. However, whenever the biphase-encoded, modulated-carrier applied to the signal input of demodulator mixer 1017 has a phase opposite this given phase, the polarity of the baseband signal output from demodulator mixer 1017 during a $T_1$ fraction of a sample period will have phase opposite this given phase and during a $T_2$ fraction of a sample period will have this given phase. Thus, the $CL_{o"}$ output sample clock is effective in sampling the biphase-encoded, modulated-carrier applied to the signal input of demodulator mixer 1017 twice during each $CL_{o"}$ sample period.

The implementation of sampled MPL latch 1016 shown in FIG. 10*a* comprises amplifier 1000, doubly-balanced mixer 1004, doubly-balanced mixer 1006, amplifier 1008, directional coupler 1009, amplifier 1002 and directional coupler 1013. The $-CL_{o"}$ output sample clock from the output of inverter 1019 is applied as the local oscillator input to each of doubly-balanced mixers 1004 and 1006 and the baseband signal output from demodulator mixer 1017, after amplification by amplifier 1000, is applied to the signal input of both mixers 1004 and 1006 and the output from mixer 1004 is also applied to the signal input of mixer 1006. The output from mixer 1006, after amplification by amplifier 10008, is applied to the signal input of MPL biphase amplifier limiter/inverter 1012. Further, the output from mixer 1006 is fed back through directional coupler 1009, amplifier 1002 and directional coupler 1013 to the input of mixer 1006. The result is that an occurrence of a reversal in the polarity of the baseband signal output from demodulator mixer 1017 being forwarded as a signal input to both mixers 1004 and 1006 at the start of a sample provides a fast response time for sampled MPL latch 1016 by causing both mixers 1004 and 1006 initially to want to operate as modulators. However, the feedback of the modulated-carrier output from mixer 1006 to the signal input of mixer 1004 forces mixer 1004 to operate as a demodulator. Therefore, only mixer 1006 actually operates as a modulator.

Because the $-CL_{o"}$ inverted sample clock applied as the local oscillator input to each of mixers 1004 and 1006 of sampled MPL latch 1016 is phase reversed with respect to the phase of the $CL_{o"}$ sample clock applied as the local oscillator input to mixer 1017, the current relative phase $+\phi$ of the pump P carrier frequency $f_c$ output from sampled MPL latch 1016 will always be the same as the current relative phase $+\phi$ of the pump P carrier frequency $f_c$ input to amplifier 1015.

For illustrative purposes, the use of the above-described MPL latch structures shown in FIGS. 9*a* and 10*a* have been directed to each comparator 404-K of the third species 100-3. However, the above-described MPL latch structure shown in either FIG. 9*a* or 10*a* may also be used in connection with each comparator 204-K of the first species 100-1 and each comparator 304-K of the second species 100-2. Specifically, in the case of comparator 204-K, the $+\phi$ output at the midpoint of coupler 210 of FIG. 2 would be applied to MPL biphase amplifier 212 through an amplifier and an MPL latch corresponding to either amplifier 915 and MPL latch 916 of FIG. 9 or amplifier 1015 and MPL latch 1016 of FIG. 10. Similarly, in the case of comparator 304-K, the $+\phi$ output at the midpoint of coupler 310 of FIG. 3 would be applied to MPL biphase amplifier 312 through an amplifier and an MPL latch corresponding to either amplifier 915 and MPL latch 916 of FIG. 9 or amplifier 1015 and MPL latch 1016 of FIG. 10.

Generically, both second species 100-2 (comprising serial-fed comparators) and third species 100-3 (comprising serial differential comparators) of A/D converter 100 are traveling-wave systems. Each of the comparators of the above-described preferred embodiments of such traveling-wave systems (1) make use of biphase-encoded, modulated-carrier inputs thereto that have peak amplitudes and phases determined by the magnitude and polarity of the analog signal that is to be digitally converted (which analog signal may have a frequency bandwidth anywhere within a range that extends from a near-D.C. frequency to a multi-gigahertz frequency), and (2) employ MPL implementations. However, the broad principles of the present invention are also applicable to the case in which the analog signal that is to be digitally converted is applied directly (i.e., without prior modulation thereby of a carrier) to at least the signal input to the first one of the ordinally-arranged comparators. In this case, the particular structure used to implement of the amplifier limiter of FIG. 3*a* or the amplifier limiter/inverter of FIG. 4*a* would depend on the frequency bandwidth of the input thereto and the desired bandwidth of the output therefrom. Further, except for the above-stated signal input to the first one of the ordinally-arranged comparators being in analog form, each of all the other inputs to the ordinally-arranged comparators and all the outputs from the ordinally-arranged comparators, per se, may be either in unmodulated form or biphase-encoded, carrier-modulated form, as the case may be. Thus, any desired combination of both unmodulated form and biphase-encoded, carrier-modulated form may be used in the implementation of the respective comparators of either second species 100-2 or third species 100-3 of A/D converter 100.

Further, the binary value corresponding to any of the MSB to the Nth MSB, in the form of a polarity-encoded, fixed-magnitude output at baseband, is available at the demodulated output from any of those doubly-balanced mixers that operate as demodulators (such as mixer 600, shown in FIGS. 6*a* and 6*b*, or mixer 8061 or 806-2, shown in FIG. 8). Therefore, in the following claims, the expression "polarity-indicative" is to be construed as being generic to both (1) a first case in which the binary value corresponding to any of the N MSB outputs is available in baseband form in accordance with the polarity of that polarity-encoded, fixed-magnitude MSB output, and (2) a second case in which the binary value corresponding to any of the N MSB outputs is available in modulated form in accordance with the phase of that biphase-encoded, fixed-amplitude carrier MSB output.

What is claimed is:

1. In a microwave-phase-logic (MPL) apparatus for converting the amplitude of an analog signal into the respective binary values of a given plural number of N binary bits that extend, in order, from a most significant bit (MSB) to an Nth MSB; an N-bit analog to biphase-encoded analog-to digital (A/D) converter comprising:

a biphase amplitude modulator responsive to said analog signal and a pump carrier frequency $f_c$ for deriving a biphase-encoded, modulated-carrier signal having a phase value determined by the current polarity of said analog signal and a peak amplitude determined by the current magnitude of said analog signal; and an ordinally-arranged group of interconnected comparators 1 to N, each of which, in order, derives a biphase-encoded, fixed-amplitude output signal having a phase value indicative of the binary value of a separate one of said MSB to said Nth MSB in response to (1) a biphase-encoded, modulated-carrier information signal having a phase value and a peak amplitude that correspond to said phase value and peak amplitude of said biphase-encoded, modulated-carrier signal from said modulator being applied as a first input to at least comparator 1 and (2) said pump carrier frequency $f_c$ being applied as a second input to each of said comparators 1 to N.

2. The apparatus defined in claim 1, wherein:

comparator K (where $1 \leq K \leq N$) includes an MPL biphase amplifier limiter/inverter, having a biphase-encoded, modulated-carrier applied as a signal input thereto with a relative phase of +φ determined by at least one input to comparator K, for deriving, as an output from said biphase amplifier limiter/inverter, a certain biphase-encoded carrier with a fixed peak-amplitude equal to $$\frac{1}{2^K}A$$

(where A is a given fixed peak-amplitude carrier) and a relative phase of −φ;

first means for applying an output from comparator K, which includes said certain biphase-encoded carrier as a component thereof, as a component of a biphase-encoded carrier input to the MPL biphase amplifier limiter/inverter of comparator K's immediately succeeding comparator K+1; and second means for applying said information signal as said input to the MPL biphase amplifier limiter/inverter of comparator 1.

3. The apparatus defined in claim 2, wherein:

an output from said amplifier limiter/inverter of comparator K constitutes said Kth MSB biphase-encoded, fixed-amplitude output.

4. The apparatus defined in claim 3, wherein:

said Kth MSB biphase-encoded, fixed-amplitude output has a relative phase of +φ.

5. The apparatus defined in claim 2, wherein:

each comparator K has said information signal applied as a first input thereto;

each comparator K, except comparator 1, has a biphase-encoded, modulated-carrier reference input applied thereto which has peak-amplitude and phase values the same as those of a biphase-encoded, modulated-carrier reference output from comparator K−1;

comparator 1 has an effectively zero-valued reference input applied thereto;

each comparator K includes a first coupler having said first and reference inputs to that comparator K applied thereto for deriving a biphase-encoded, modulated-carrier having a peak-amplitude substantially equal to the algebraic sum of said first and reference inputs to comparator K and the phase value of the larger one of the peak-amplitudes of said first and reference inputs to comparator K, which derived biphase-encoded, modulated-carrier is applied as said input to said MPL biphase amplifier limiter/inverter; and each comparator K includes a second coupler having said biphase-encoded, modulated-carrier reference output from comparator K−1 and said certain biphase-encoded carrier output from said biphase amplifier limiter/inverter of comparator K applied as first and second inputs to said second coupler for deriving a biphase-encoded, modulated-carrier reference output from comparator K having a peak-amplitude substantially equal to the algebraic sum of said first and second inputs to said second coupler and the phase value of the larger one of the peak-amplitudes of said first and second inputs to said second coupler.

6. The apparatus defined in claim 5, further comprising:

third means, including a first power divider, for applying said biphase-encoded, modulated-carrier signal from said modulator as said information-signal first input to each of said comparators 1 to N in parallel; and fourth means, including a second power divider, for applying said pump carrier frequency $f_c$ as a second input to each of said comparators 1 to N in parallel.

7. The apparatus defined in claim 5, further comprising:

third means, including an amplifier between each ordinally adjacent pair of said comparators 1 to N and a directional coupler corresponding to each of said comparators 1 to N, for applying said biphase-encoded, modulated-carrier signal from said modulator as said information-signal first input to each of said comparators 1 to N in series; and fourth means, also including an amplifier between each ordinally adjacent pair of said comparators 1 to N and a directional coupler corresponding to each of said comparators 1 to N, for applying said pump carrier frequency $f_c$ as a second input to each of said comparators 1 to N in series.

8. The apparatus defined in claim 2, wherein:

each comparator K includes a coupler having said biphase-encoded, modulated-carrier output from comparator K−1 and said certain biphase-encoded carrier output from said biphase amplifier limiter/inverter of comparator K applied as first and second inputs to said coupler for deriving a biphase-encoded, modulated-carrier output from comparator K having a peak-amplitude substantially equal to the algebraic sum of said first and second inputs to said coupler and the phase value of the larger one of the peak-amplitudes of said first and second inputs to said second coupler; and said biphase-encoded, modulated-carrier output from comparator K is applied as a signal input to said amplifier limiter/inverter of its immediately succeeding comparator K+1.

9. The apparatus defined in claim 8, wherein each comparator K further includes:

a second coupler having said biphase-encoded, modulated-carrier output from comparator K−1 applied to the midpoint thereof;

third means for forwarding a biphase-encoded, modulated-carrier output from a first end of said second coupler as said signal input to said amplifier limiter/inverter of comparator K;

fourth means for forwarding said certain biphase-encoded carrier output from said biphase amplifier limiter/inverter of comparator K to said first end of said first-mentioned coupler; and delay means for forwarding a biphase-encoded, modulated-carrier output from a second end of said second coupler to said second end of said first-mentioned coupler with a delay substantially equal to the total delay inserted by said first means, said biphase amplifier limiter/inverter and said second means;

whereby said biphase-encoded, modulated-carrier output from comparator K is derived at the midpoint of said first-mentioned coupler.

10. The apparatus defined in claim 9, wherein:

said third means of comparator K includes an MPL latch responsive to a sample clock applied thereto having a duty cycle which is effective in causing said latch to forward said modulated-carrier output from said first end of said second coupler as said signal input to said amplifier limiter/inverter of comparator K for only a given proper fraction of each sample period of said sample clock; and an output from said amplifier limiter/inverter of comparator K constitutes said Kth MSB biphase-encoded, fixed-amplitude output.

11. The apparatus defined in claim 10, wherein said latch comprises:
  a first doubly-balanced mixer having said pump carrier frequency $f_c$ applied as a local-oscillator input thereto for demodulating a modulated-carrier applied as a modulated signal input thereto;
  fifth means for forwarding said biphase-encoded, modulated-carrier output from said first end of said second coupler as said modulated signal input to said first doubly-balanced mixer and thereby derive a demodulated baseband output from said first doubly-balanced mixer;
  a second doubly-balanced mixer having a sample clock, which comprises said pump carrier frequency $f_c$ during said given proper fraction of each sample period of said sample clock and a zero level during a remaining proper fraction of each sample period of said sample clock, applied as a local-oscillator input thereto for modulating a baseband signal applied as an input thereto;
  sixth means for forwarding said demodulated baseband output from said first doubly-balanced mixer as said baseband signal input to said second doubly-balanced mixer and thereby derive a modulated output from said second doubly-balanced mixer;
  seventh means for forwarding said modulated output from said second doubly-balanced mixer as said signal input to said amplifier limiter/inverter; and
  feedback means including a first directional coupler, an amplifier and a second directional coupler for feeding back said modulated output from said second doubly-balanced mixer as a feedback input to said first doubly-balanced mixer.

12. The apparatus defined in claim 9, wherein:
  said third means of comparator K includes an MPL latch responsive to a sample clock applied to said third means for forwarding successive samples of the then-current phase of biphase-encoded, modulated-carrier output from said first end of said second coupler as said signal input to said amplifier limiter/inverter of comparator K;
  said sample clock having a duty cycle which is effective in (1) causing said latch to forward the then-current phase of each of said successive biphase-encoded carrier samples during a first-occurring given proper fraction of each sample period of said sample clock as said input to the MPL biphase amplifier limiter/inverter of comparator K for that given proper fraction of each sample period of said sample clock, and (2) causing said latch to forward the then-current phase of each of said successive biphase-encoded carrier samples during a second-occurring remaining fraction of each sample period of said sample clock as said input to the MPL biphase amplifier limiter/inverter of comparator K for that remaining fraction of each sample period of said sample clock; and
  an output from said amplifier limiter/inverter of comparator K constitutes said Kth MSB biphase-encoded, fixed-amplitude output.

13. The apparatus defined in claim 12, wherein said third means comprises:
  a first doubly-balanced mixer having said modulated-carrier output from said first end of said second coupler applied as a signal input thereto and said sample clock applied as a local-oscillator input thereto for demodulating said signal input thereto, said sample clock comprising said pump carrier frequency $f_c$ having a given phase during said given proper fraction of each sample period thereof and a phase opposite said given phase during said remaining proper fraction of each sample period whereby said first doubly-balanced mixer operates as a demodulator for deriving baseband output;
  fourth means for applying said baseband output from said first doubly-balanced mixer as a signal input to said latch;
  inverter means responsive to said sample clock for applying an inverted sample clock as a control input to said latch; and
  fifth means for applying the output from said latch as said signal input to said amplifier limiter/inverter of comparator K.

14. The apparatus defined in claim 13, wherein said MPL latch comprises:
  second and third doubly-balanced mixers having said inverted sample clock applied as a local-oscillator input to each of them;
  said fourth means applying the baseband output from said first doubly-balanced mixer as a signal input to each of said second and third doubly-balanced mixers;
  fifth means for applying the output of said second doubly-balanced mixer as an additional signal input to said third doubly-balanced mixer, whereby said third doubly-balanced mixer operates as a modulator;
  sixth means for forwarding said output from said third doubly-balanced mixer as said output from said latch; and
  feedback means including a first directional coupler, an amplifier and a second directional coupler for feeding back said modulated output from said third doubly-balanced mixer as a feedback input to said second doubly-balanced mixer, whereby said feedback forces said second doubly-balanced mixer to operate as a demodulator.

15. The apparatus defined in claim 2, wherein:
  said first means of comparator K includes third means including an MPL latch responsive to a sample clock applied to said third means for forwarding the current phase of each of successive biphase-encoded carrier samples as said input to the MPL biphase amplifier limiter/inverter of comparator K; and
  an output from said amplifier limiter/inverter of comparator K constitutes said Kth MSB biphase-encoded, fixed-amplitude output.

16. The apparatus defined in claim 15, wherein:
  said sample clock has a duty cycle which is effective in causing said latch to forward the then current phase of each of said successive biphase-encoded carrier samples as said input to the MPL biphase amplifier limiter/inverter of comparator K for only a given proper fraction of each sample period of said sample clock.

17. The apparatus defined in claim 15, wherein:
  said sample clock has a duty cycle which is effective in (1) causing said latch to forward the then current phase of each of said successive biphase-encoded carrier samples during a first-occurring given proper fraction of each sample period of said sample clock as said input to the MPL biphase amplifier limiter/inverter of comparator K for that given proper fraction of each sample period of said sample clock, and (2) ) causing said latch to forward the then current phase of each of said successive biphase-encoded carrier samples during a second-occurring remaining fraction of each sample period of said sample clock as said input to the MPL biphase amplifier limiter/inverter of comparator K for that remaining fraction of each sample period of said sample clock.

18. The apparatus defined in claim 2, wherein said amplifier limiter/inverter of each comparator K comprises:

a first doubly-balanced mixer having said pump carrier frequency $f_c$ applied as a local-oscillator input thereto for demodulating a modulated-carrier applied as a modulated signal input thereto;

first means including a high-gain amplifier for forwarding said biphase-encoded, modulated-carrier input to said amplifier limiter/inverter as said modulated signal input to said first doubly-balanced mixer with a sufficiently high peak amplitude to overdrive said first doubly-balanced mixer and thereby derive a demodulated baseband output from said first doubly-balanced mixer that has (1) a fixed-magnitude and (2) a polarity corresponding to the phase value of said biphase-encoded, modulated-carrier input to said amplifier limiter/inverter;

a second doubly-balanced mixer having said pump carrier frequency $f_c$ applied as a local-oscillator input thereto for modulating a baseband signal applied as an input thereto;

second means for forwarding said demodulated baseband output from said first doubly-balanced mixer as said baseband signal input to said second doubly-balanced mixer and thereby derive a biphase-encoded, fixed peak-amplitude carrier output from said second doubly-balanced mixer that has a phase value corresponding to said polarity of said baseband output from said first doubly-balanced mixer; and said biphase-encoded, fixed peak-amplitude carrier output from said second doubly-balanced mixer constituting the Kth MSB output signal from said comparator K.

19. The apparatus defined in claim 18, wherein said amplifier limiter/inverter of each comparator K further comprises:

third means, including an inverter and an attenuator, responsive to said biphase-encoded, fixed peak-amplitude carrier output from said second doubly-balanced mixer being applied as an input thereto for deriving said certain biphase-encoded carrier with a fixed peak-amplitude equal to $$\frac{1}{2^K} A$$

and a relative phase of $-\phi$ as said output from said biphase amplifier limiter/inverter of comparator K.

20. The apparatus defined in claim 18, wherein said amplifier limiter/inverter of each comparator K further comprises:

a third doubly-balanced mixer;
a variable amplifier;
a variable inverting phase shifter;
third means for applying said demodulated baseband output from said first doubly-balanced mixer as a first input to said third doubly-balanced mixer and for applying and said pump carrier frequency $f_c$ through said variable amplifier and variable inverting phase shifter as a second input to said third doubly-balanced mixer, whereby said third doubly-balanced mixer operates as a modulator that derives a biphase-encoded, carrier output having respective fixed peak-amplitude and phase values determined by the settings of said variable amplifier and variable phase shifter; and said variable amplifier and variable phase shifter of each comparator K being set so that said biphase-encoded carrier output of said third doubly-balanced mixer, which constitutes said certain biphase-encoded carrier output from said biphase amplifier limiter/inverter of comparator K, has a fixed peak-amplitude equal to $$\frac{1}{2^K} A$$

and a relative phase of $-\phi$.

21. The apparatus defined in claim 1, wherein said biphase amplitude modulator comprises:

first and second doubly-balanced mixers;
a first D.C. bias "T" having a given magnitude and given polarity D.C. bias applied thereto;
a second D.C. bias "T" having a given magnitude and a polarity opposite to said given polarity D.C. bias applied thereto;
first and second variable phase shifters;
an amplifier;
first means for applying a first analog signal through said first D.C. bias "T" as a first input to said first doubly-balanced mixer;
second means for applying a termination to ground, which may include a second analog signal, through said second D.C. bias "T" as a first input to said second doubly-balanced mixer;
third means for applying said pump carrier frequency as a second input to said first doubly-balanced mixer and as a second input to said second doubly-balanced mixer;
fourth means for applying an output from said first doubly-balanced mixer through said first variable phase shifter as a first portion of an input to said amplifier;
fifth means for applying an output from said second doubly-balanced mixer through said second variable phase shifter as a second portion of said input to said amplifier; and
sixth means for forwarding an output from said amplifier as said output from said biphase amplitude modulator.

22. The apparatus defined in claim 21, wherein:
said first means includes seventh means for applying a single analog signal through a first capacitance to said first D.C. bias "T"; and
said second means includes seventh means for applying said single analog signal through a second capacitance to said second D.C. bias "T";
whereby said single analog signal constitutes each of said first and second analog signals.

23. The apparatus defined in claim 1, further comprising:
sample clock means for creating periodically-occurring sample clocks for use in deriving samples of the then-current phase value of each of N biphase-encoded signals that individually correspond to a separate one of said N comparators.

24. The apparatus defined in claim 23, wherein:
said sample clock means further derives periodically-occurring second sample clocks having substantially the same sample period as said first-mentioned sample clocks;

means for applying each of said periodically-occurring second sample clocks to said biphase amplitude modulator; and said biphase amplitude modulator is responsive to the application of each of said second sample clocks thereto for maintaining for substantially a sample period the particular phase value and particular peak amplitude of said biphase-encoded carrier signal that has been determined, respectively, by the then-current polarity and magnitude of said analog signal during the occurrence of that second sample clock.

25. The apparatus defined in claim 23, wherein said sample clock means comprises:

first and second doubly-balanced mixers;

first means for applying said pump carrier $f_c$ to a first input of each of said first and second doubly-balanced mixers;

second means for applying a D.C. bias voltage to a second input of said first doubly-balanced mixer;

third means for applying a switching frequency $f_c/4$ to a second input of said second doubly-balanced mixer;

fourth means for deriving said periodically-occurring sample clocks as the algebraic sum of respective outputs from said first and second doubly-balanced mixers; and said D.C. bias voltage having a value such that the algebraic sum of respective outputs from said first and second doubly-balanced mixers is substantially zero during a certain one of the first and second half-cycles of each cycle of said switching frequency $f_c/4$, whereby two cycles of frequency $f_c$, having a peak amplitude larger than that of said pump carrier occur during the other one of the first and second half-cycles of each cycle of said switching frequency $f_c/4$.

26. The apparatus defined in claim 23, wherein said sample clock means comprises:

a doubly-balanced mixer;

first means for applying said pump carrier $f_c$ to a first input of said doubly-balanced mixer; and second means for applying a switching frequency $f_c/2$ to a second input of said second doubly-balanced mixer;

whereby said doubly-balanced mixer derives an output comprising one cycle of said pump carrier $f_c$ having a given phase during each positive half-cycle of said switching frequency and one cycle of said pump carrier $f_c$ having a phase opposite to said given phase during each negative half-cycle of said switching frequency.

27. The apparatus defined in claim 23, further comprising:

an ordinally-arranged group of sample and hold means 1 to N each of which has each of said sample clocks applied to it for first sampling, and then holding for a sample period, the then-current phase value of that separate one of said MSB to said Nth MSB biphase-encoded output signals from the comparator which corresponds in order thereto.

28. The apparatus defined in claim 27, wherein each of said ordinally-arranged group of sample and hold means comprises:

first and second closed-loop memories each including first and second doubly-balanced mixers and an amplifier, with the output of said amplifier being coupled to a first input of said first doubly-balanced mixer, the output of said first doubly-balanced mixer being coupled to a first input of said second doubly-balanced mixer and the output of said second doubly-balanced mixer being coupled to an input of said amplifier;

(fifth) first means for applying said pump carrier $f_c$ to a second input of each of said first doubly-balanced mixers of said first and second closed-loop memories and to a second input of said second doubly-balanced mixer of said second closed-loop memory, whereby each of said first doubly-balanced mixers of said first and second closed-loop memories operates as a demodulator and said second doubly-balanced mixer of said second closed-loop memory operates as a modulator that derives a biphase-encoded carrier output having a given peak amplitude;

(sixth) second means for applying each of said periodically-occurring sample clocks from said sample clock means to a second input of said second doubly-balanced mixer of said first closed-loop memory; whereby said second doubly-balanced mixer of said first closed-loop memory operates as a modulator that derives a biphase-encoded carrier output having a zero amplitude during one half of the sample period of each sample clock and a peak amplitude larger than that of said (given) fixed amplitude of that separate one of said MSB to said Nth MSB biphase-encoded output signals from the comparator which corresponds in order to that sample and hold means during the other half of the sample period of each sample clock;

(seventh) third means for applying to the input of said amplifier of said first closed-loop memory that separate one of said MSB to said Nth MSB biphase-encoded output signals from the comparator which corresponds in order to that sample and hold means; and (eighth) fourth means for applying to the input of said amplifier of said second closed-loop memory said biphase-encoded carrier output from said second doubly-balanced mixer of said first closed-loop memory.

29. The apparatus defined in claim 1, wherein:

comparator 1 comprises first means for deriving said MSB biphase-encoded output signal with a certain phase value determined by the current phase value of said information signal applied thereto;

whereby said certain phase value of the MSB biphase-encoded output signal derived by comparator 1 is indicative of the polarity of said analog signal.

* * * * *